US 6,552,394 B2

(12) United States Patent
Ahmad et al.

(10) Patent No.: US 6,552,394 B2
(45) Date of Patent: *Apr. 22, 2003

(54) SEMICONDUCTOR TRANSISTOR DEVICES AND STRUCTURES WITH HALO REGIONS

(75) Inventors: Aftab Ahmad, Boise, ID (US); David J. Keller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/998,420

(22) Filed: Nov. 29, 2001

(65) Prior Publication Data
US 2002/0074597 A1 Jun. 20, 2002

Related U.S. Application Data

(60) Continuation of application No. 09/167,174, filed on Oct. 6, 1998, now Pat. No. 6,333,539, which is a division of application No. 08/677,266, filed on Jul. 9, 1996, now Pat. No. 6,346,439.

(51) Int. Cl.[7] .............................................. H01L 29/76
(52) U.S. Cl. ........................ 257/344; 257/408; 438/301
(58) Field of Search ............................... 257/336, 337, 257/344, 408, 900; 408/301–306

(56) References Cited

U.S. PATENT DOCUMENTS

| 3,660,735 A | 5/1972 | McDougall ............... 317/235 R |
| 4,149,904 A | 4/1979 | Jones .......................... 148/1.5 |
| 4,198,250 A | 4/1980 | Jecmen ...................... 148/1.5 |
| 4,356,623 A | 11/1982 | Hunter |
| 4,697,333 A | 10/1987 | Nakahara .................... 437/20 |
| 4,703,551 A | 11/1987 | Szluk et al. |
| 4,745,086 A | 5/1988 | Parillo et al. |
| 4,760,033 A | 7/1988 | Mueller et al. ............. 437/34 |
| 4,843,023 A * | 6/1989 | Chiu et al. .................. 438/231 |

(List continued on next page.)

FOREIGN PATENT DOCUMENTS

| EP | 000071335 | 2/1983 | ................. 257/344 |
| JP | 363066967 | 3/1988 | ................. 257/344 |
| JP | 363095670 | 4/1988 | ................. 257/344 |
| JP | 364037055 | 2/1989 | ................. 257/344 |
| JP | 401208869 | 8/1989 | ................. 257/344 |
| JP | 0-298023 | 10/1990 | |

OTHER PUBLICATIONS

Jung, D. et al., "A 0.25 µm CMOSFET Using Halo Implantation for 1Gb DRAM", Extended Abstracts of the 1995 Internatl. Conf. on Solid State Devices and Materials, Osaka, JP, published Sep. 1995, pp. 869–871.

"Simplified Lightly Doped Drain Process"; IBM Technical Disclosure Bulletin, vol. 30 No. 12, pp. 180–181.

*Primary Examiner*—Tom Thomas
*Assistant Examiner*—Ori Nadav
(74) *Attorney, Agent, or Firm*—Wells St. John P.C.

(57) ABSTRACT

The invention encompasses a transistor device comprising a region of a semiconductor material, and a transistor gate over a portion of the region. The device comprises a pair of opposing sidewall spacers adjacent sidewalls of the transistor gate and a pair of opposing first conductivity type source/drain regions within the semiconductor material proximate the transistor gate. The entirety of the semiconductor material under one of the sidewall spacers being defined as a first segment, and the entirety of the semiconductor material which is under the other of the sidewall spacers being defined as a second segment. The first and second segments of the semiconductor material are separated from the first and second source/drain regions by first and second gap regions, respectively, of the semiconductor material. The device further comprises a pair of opposing second conductivity type halo regions within the first and second gap regions.

17 Claims, 20 Drawing Sheets

U.S. PATENT DOCUMENTS

| | | | |
|---|---|---|---|
| 4,859,618 A | 8/1989 | Shikata et al. | 437/41 |
| 4,935,379 A | 6/1990 | Toyoshima | |
| 4,949,136 A * | 8/1990 | Jain | 257/344 |
| 5,147,811 A | 9/1992 | Skagami | 438/302 |
| 5,185,280 A | 2/1993 | Houston et al. | 437/44 |
| 5,217,910 A | 6/1993 | Shimizu et al. | 438/231 |
| 5,227,321 A | 7/1993 | Lee et al. | 437/44 |
| 5,244,823 A | 9/1993 | Adan | 437/41 |
| 5,272,367 A | 12/1993 | Dennison et al. | |
| 5,274,261 A * | 12/1993 | Chen | 257/344 |
| 5,296,401 A | 3/1994 | Mitsui et al. | |
| 5,321,283 A | 6/1994 | Cogan et al. | 257/256 |
| 5,395,773 A | 3/1995 | Ravindhran et al. | 437/27 |
| 5,401,994 A | 3/1995 | Adan | 257/335 |
| 5,405,791 A | 4/1995 | Ahmad | |
| 5,424,567 A | 6/1995 | Chen | 257/315 |
| 5,439,834 A | 8/1995 | Chen | |
| 5,482,878 A | 1/1996 | Burger et al. | 437/41 |
| 5,489,546 A | 2/1996 | Ahmad et al. | 437/57 |
| 5,500,379 A | 3/1996 | Odake et al. | 438/232 |
| 5,534,449 A | 7/1996 | Dennison et al. | |
| 5,536,959 A | 7/1996 | Kellam | |
| 5,595,919 A | 1/1997 | Pan | 437/29 |
| 5,614,432 A | 3/1997 | Goto | 438/231 |
| 5,650,343 A | 7/1997 | Luning et al. | 437/36 |
| 5,654,212 A | 8/1997 | Jang | 438/231 |
| 5,719,425 A | 2/1998 | Akram et al. | 257/344 |
| 5,747,852 A | 5/1998 | Chang et al. | |
| 5,866,460 A | 2/1999 | Akram et al. | 438/306 |
| 5,929,483 A * | 7/1999 | Kim et al. | 257/336 |
| 6,044,843 A | 4/2000 | Huang | 438/241 |
| 6,333,539 B1 * | 12/2001 | Ahmad et al. | 257/344 |

* cited by examiner

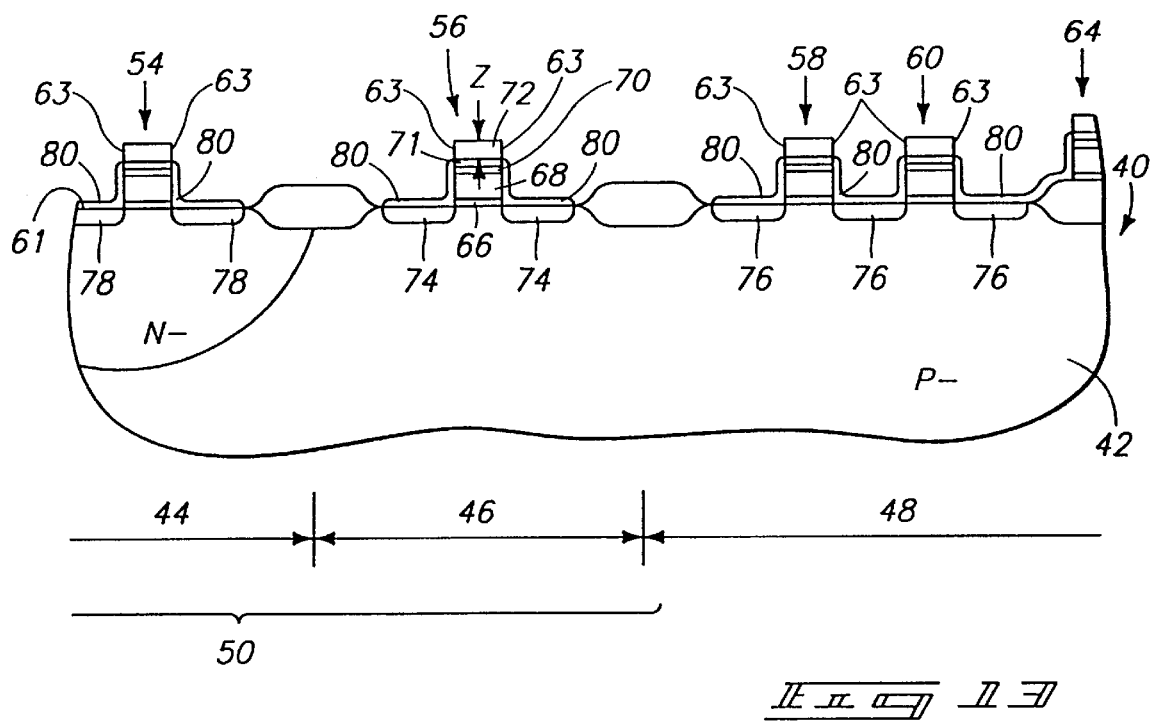
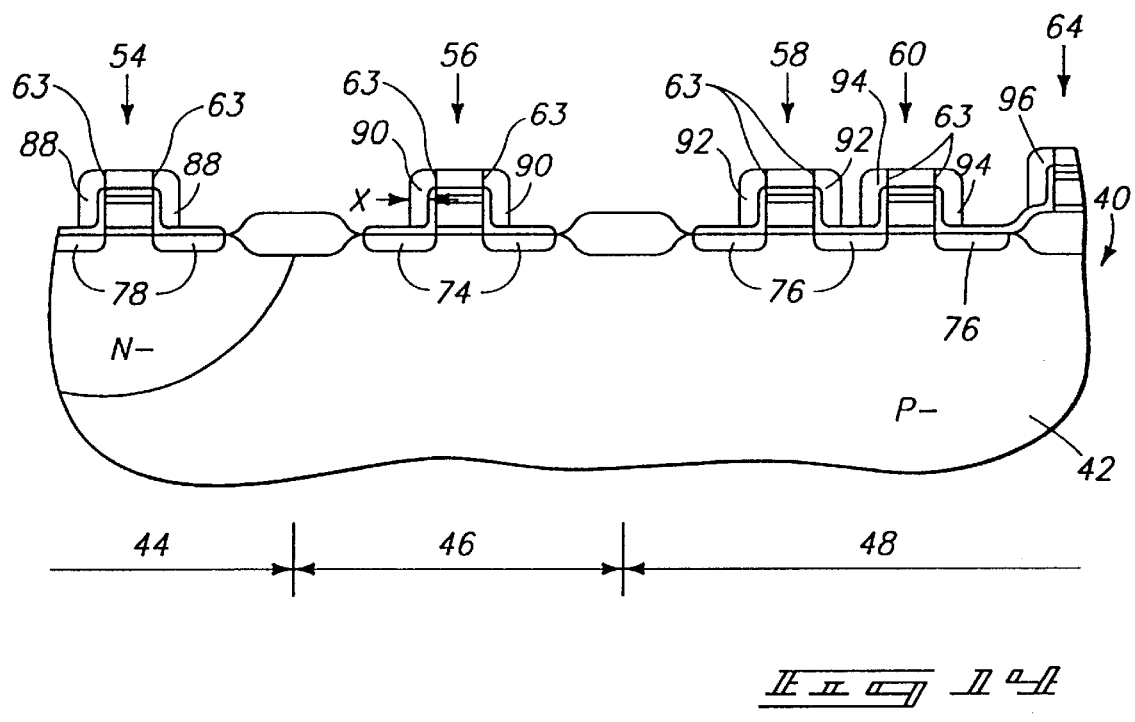

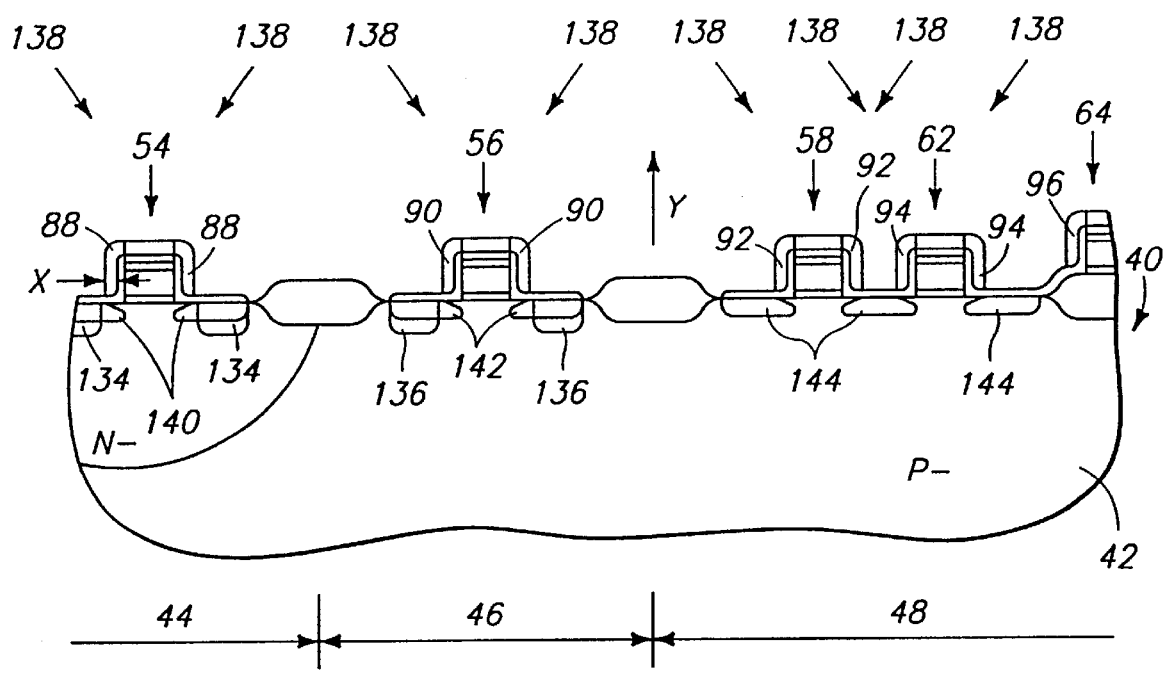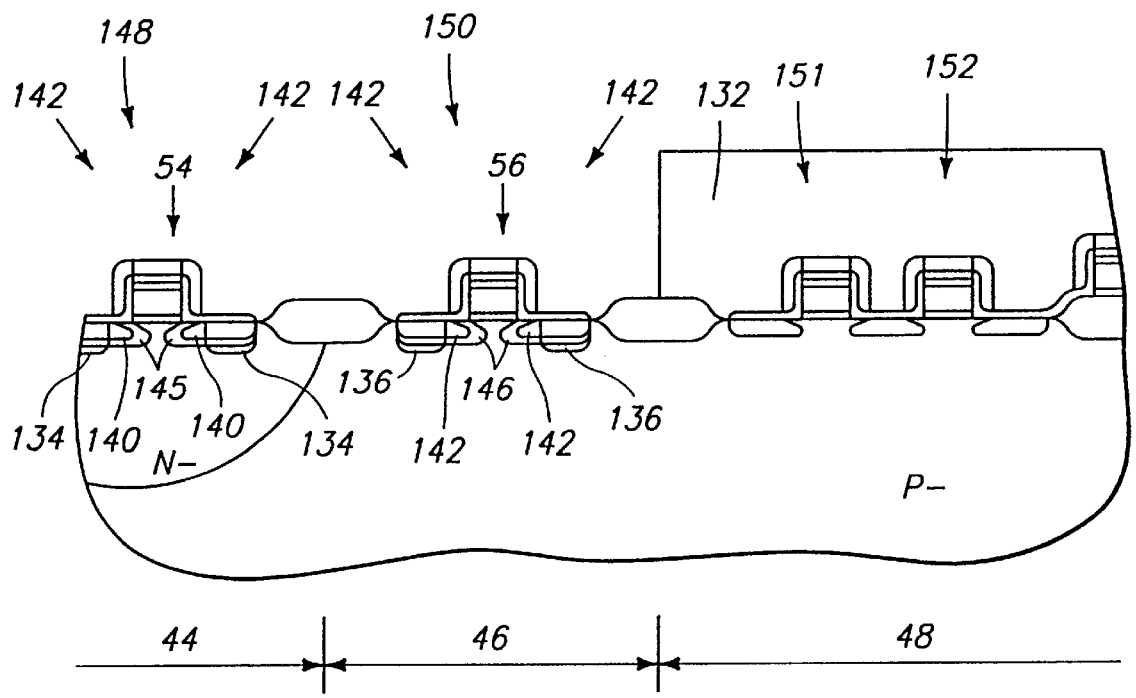

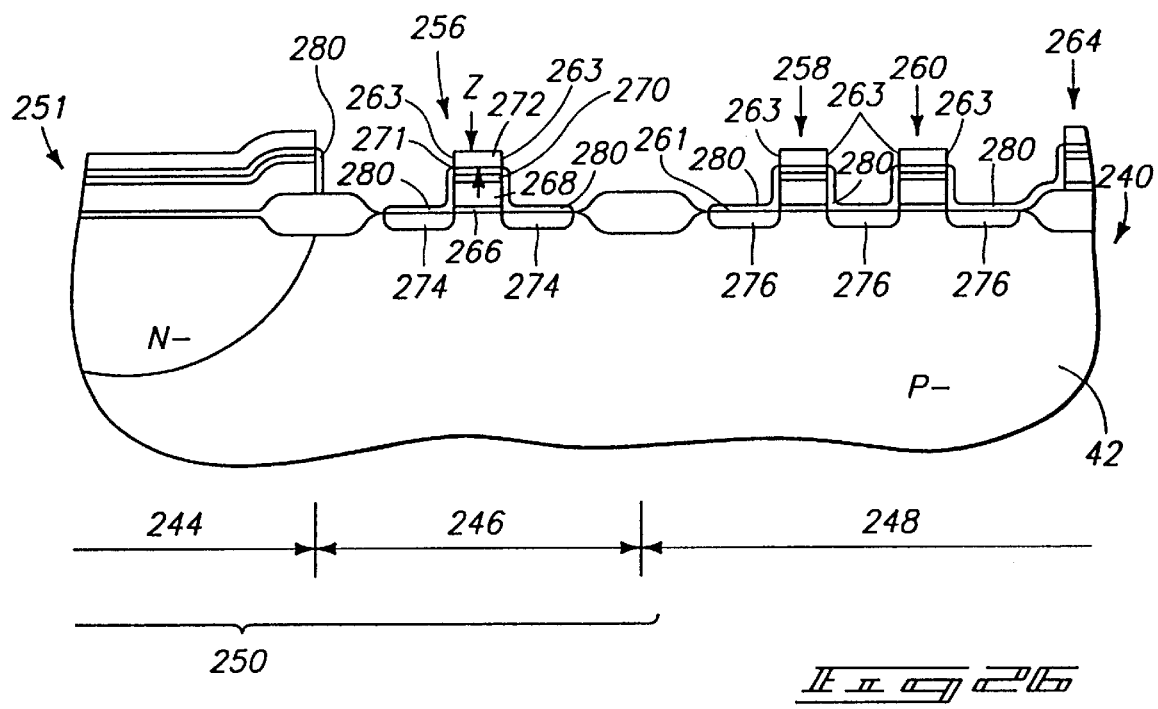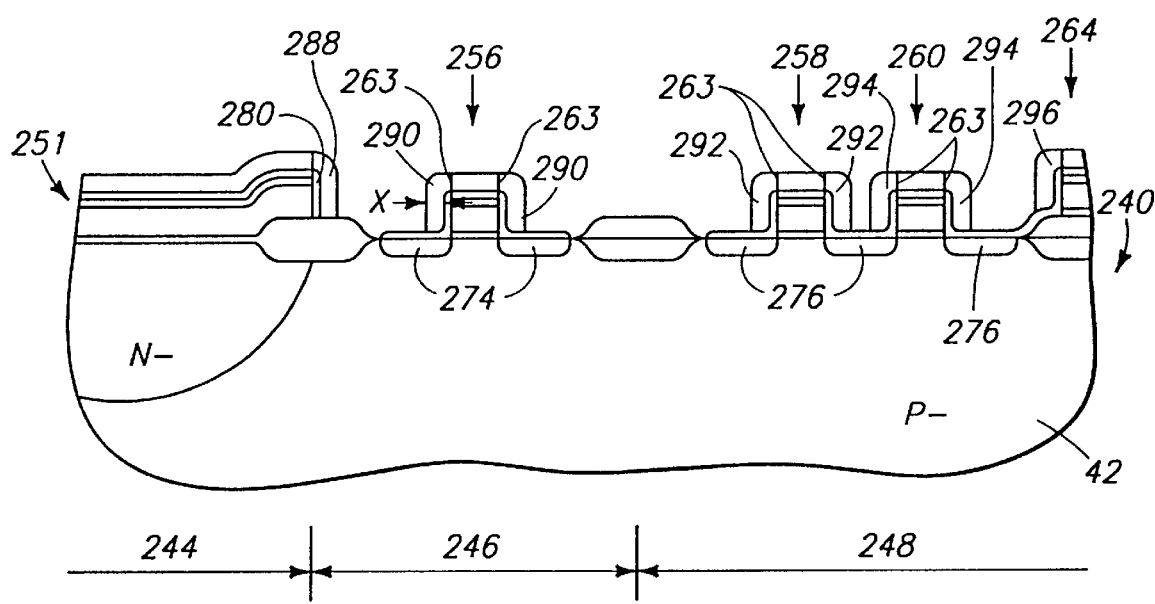

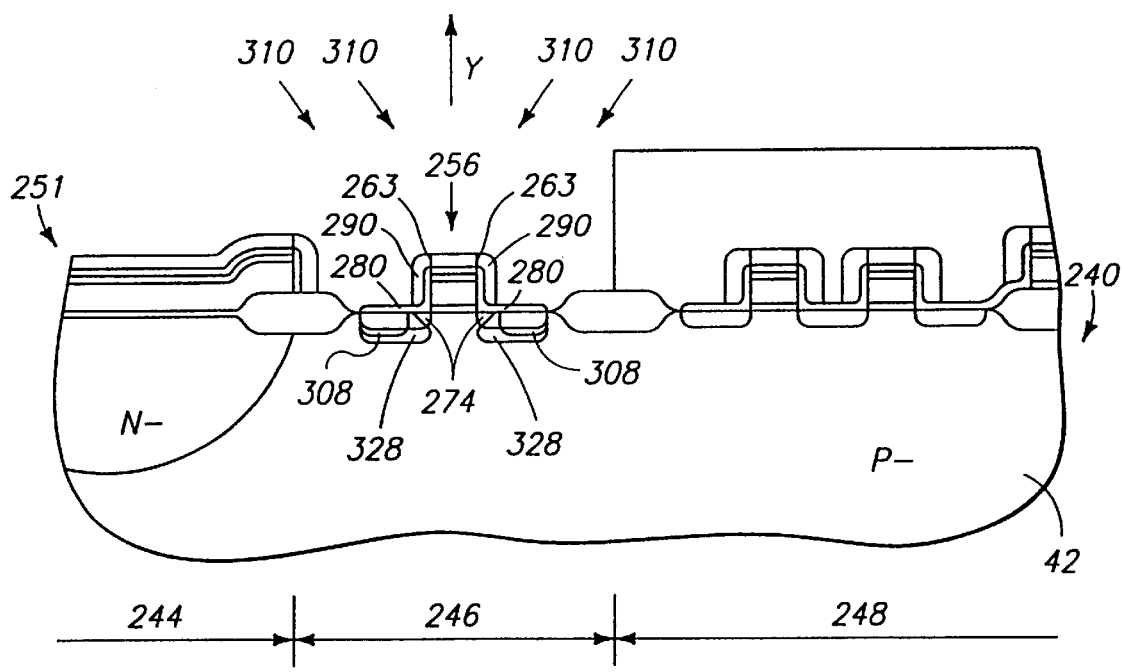
FIG. 3III
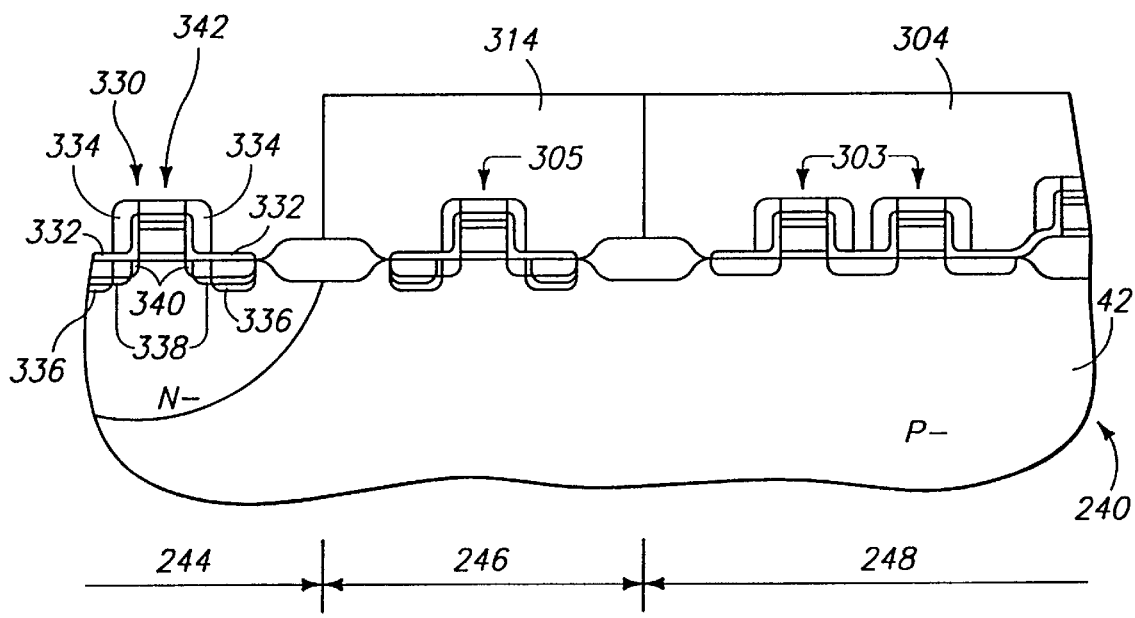
FIG. 3JJ

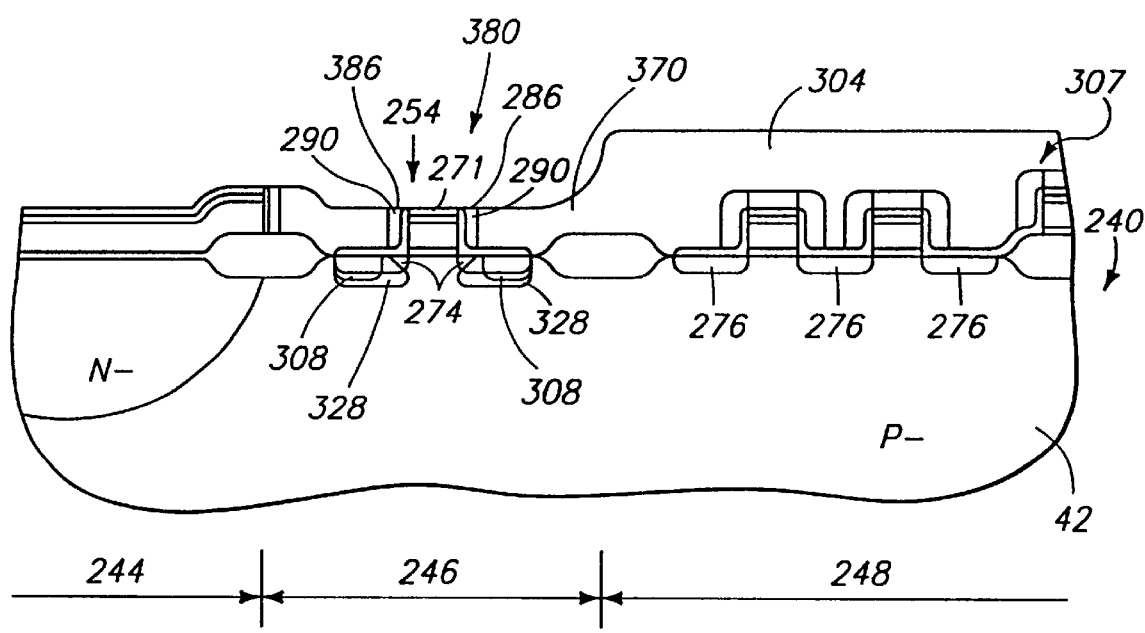

SEMICONDUCTOR TRANSISTOR DEVICES AND STRUCTURES WITH HALO REGIONS

RELATED PATENT DATA

This patent resulted from a continuation application of U.S. patent application Ser. No. 09/167,174, now U.S. Pat No. 6,333,539, filed on Oct. 6, 1998, that is a divisional application of U.S. patent application Ser. No. 08/677,266, now U.S. Pat. No. 6,346,439, filed on Jul. 9, 1996.

This patent resulted from a continuation of U.S. Pat. No. 6,333,539, filed on Oct. 6, 1998, that is a divisional application of U.S. Pat. No. 6,346,439, filed on Jul. 9, 1996.

TECHNICAL FIELD

This patent pertains to methods of forming graded junction regions operatively adjacent transistor gates, methods of forming graded junction regions operatively adjacent transistor gates of CMOS circuitry, and methods of forming graded junction regions operatively adjacent peripheral NMOS transistor gates and operatively adjacent the transistor gates of a memory array. The patent also pertains to semiconductor transistor devices generally.

BACKGROUND OF THE INVENTION

This invention grew out of a need to improve the methods of implanting graded junction regions within semiconductor devices and to thereby enhance production of integrated circuitry. Some typical types of graded junction regions are described with reference to FIG. 1.

In FIG. 1 is shown a semiconductor wafer fragment 10 comprising a portion of a semiconductor wafer material 12. Wafer 12 comprises an upper surface 13. Preferably, the semiconductor material of wafer 12 comprises conductively doped polysilicon. Above and within semiconductor wafer 12 is formed a transistor device 14. Device 14 comprises a gate 16, source/drain regions 18, and graded junction regions 20 and 22.

Gate 16 further comprises a gate oxide layer 24, a polysilicon layer 26, a refractory metal layer 28, an upper oxide layer 29, and a cap layer 30. Refractory metal layer 28 typically comprises a metal-silicide, such as tungsten silicide or titanium silicide, and cap layer 30 preferably comprises silicon nitride.

Gate 16 also comprises opposing lateral sidewalls 32. Sidewall spacers 34 are adjacent sidewalls 32 and comprise a sidewall spacer material, preferably silicon nitride. Sidewall spacers 34 comprise a lateral thickness "X", which as measured at about the height of metal layer 28 is typically from about 200 Angstroms to about 1000 Angstroms.

Also, adjacent lateral sidewalls 32 is a silicon oxide layer 36. Silicon oxide layer 36 is generally formed by oxidizing the polysilicon of gate 16 and the polysilicon of upper surface 13 of wafer 12.

Source/drain regions 18 contain a conductivity enhancing dopant of a type dictated by the type of transistor device 14. If transistor device 14 is a P-channel Metal-Oxide Semiconductor (PMOS) field effect transistor, then source/drain regions 18 will comprise a p-type dopant. If, on the other hand, transistor device 14 is an N-channel Metal-Oxide Semiconductor (NMOS) field effect transistor, source/drain regions 18 will comprise n-type dopant.

Graded junction regions 20 and 22 are typically lightly doped drain (LDD) regions and halo regions. Generally, and preferably, the graded junction region extending nearest to gate 16, i.e., region 22, will be a halo region and the other graded junction region, i.e., region 20, will be an LDD region. However, the order of the graded junction regions can be reversed. Also, one or both of the graded junction regions may be eliminated in various transistor devices.

The LDD regions comprise conductivity enhancing dopant of the same conductivity type as the adjacent source/drain regions. Thus, in an NMOS device the LDD regions comprise n-type dopant and in a PMOS device the LDD regions comprise p-type dopant. The LDD regions reduce the electric field under gate 16 and thereby reduce the energy of hot electrons within transistor device 14. Such reduction in energy can reduce the damage caused to device 14 by hot electrons.

The halo regions comprise conductivity enhancing dopant of a different conductivity type than the adjacent source/drain regions. Thus, in an NMOS device the halo regions comprise a p-type dopant and in a PMOS device the halo regions comprise n-type dopant. The halo regions are used to improve the punch-through resistance of transistor device 14.

Referring to FIG. 2, a semiconductor wafer fragment 40 is illustrated at a processing step in accordance with the prior art. Fragment 40 comprises a portion of semiconductor wafer material 42. The semiconductor material of wafer 42 preferably comprises conductively doped polysilicon. The shown wafer fragment 40 is subdivided into three defined regions: PMOS region 44 (only a portion of which is shown), peripheral NMOS region 46, and memory array region 48 (only a portion of which is shown). Regions 44 and 46 together comprise a defined peripheral region 50 (only a portion of which is shown).

The semiconductor material of wafer 42 within peripheral NMOS region 46 and memory array region 48 is typically polysilicon lightly doped with a p-type impurity. The semiconductor material of wafer 42 within PMOS region 44 is typically polysilicon comprising a well 52 which is lightly doped with an n-type impurity.

A series of transistor gates 54, 56, 58 and 60 are provided on a top surface 61 of wafer 42. Gate 54 corresponds to a PMOS transistor gate, gate 56 corresponds to a peripheral NMOS transistor gate, and gates 58 and 60 correspond to memory array NMOS transistor gates. Also shown are field oxide regions 62 between the transistor gates and a word line 64 (only a portion of which is shown) over one of the field oxide regions. Gates 54, 56, 58 and 60, as well as word line 64, all comprise a gate oxide layer 66, a polysilicon layer 68, a refractory metal layer 70, an upper oxide layer 71, and a cap 72, as was described previously regarding transistor device 14. Further, each of gates 54, 56, 58, and 60, as well as word line 64, comprise opposing lateral sidewalls 63.

A prior art processing method of forming graded junction regions for the circuitry of FIG. 2 is described with reference to FIGS. 3–6.

Referring to FIG. 3, n-type regions 74 and 76 are implanted into peripheral and memory NMOS regions 46 and 48 respectively. Regions 74 are peripheral NMOS LDD regions implanted operatively adjacent peripheral NMOS gate 56, while regions 76 are memory array source/drain regions implanted operatively adjacent memory array NMOS gates 58 and 60. As the memory array source/drain regions 76 are typically implanted at a dopant concentration and depth comparable to the peripheral NMOS LDD regions 74, regions 74 and 76 are typically implanted during a common implant step.

Also referring to FIG. 3, p-type LDD regions are implanted operatively adjacent PMOS gate 54 to form PMOS LDD regions 78.

After the implant of regions 74, 76, and 78, the polysilicon of gates 54, 56, 58 and 60 as well as of word line 64 and upper surface 61 is oxidized to form the silicon oxide layer 80.

Referring to FIG. 4, a first masking layer provision step occurs as PMOS region 44 and memory array region 48 are covered with a masking layer 82, preferably of photoresist. Subsequently, a p-type dopant 84 is implanted into peripheral NMOS region 46 to form peripheral NMOS halo regions 86 operatively adjacent peripheral NMOS gate 56. Halo regions 86 are displaced further from gate 56 than LDD regions 74 as a result of LDD regions 74 being implanted prior to formation of oxide layer 80 and halo regions 86 being implanted subsequent to formation of oxide layer 80.

Referring to FIG. 5, masking layer 82 is removed and subsequently sidewall spacers 88, 90, 92, 94 and 96 are provided adjacent gates 54, 56, 58, 60 and word line 64, respectively.

Referring to FIG. 6, a second masking layer provision step occurs as PMOS region 44 and memory array region 48 are again masked, this time with a masking layer 98, preferably of photoresist. Subsequently, n-type dopant 100 is implanted into peripheral NMOS region 46 to form peripheral NMOS source/drain regions 102 operatively adjacent peripheral NMOS gate 56. Source/drain regions 102 are displaced further from gate 56 than graded junction regions 74 and 86 as a result of source/drain regions 102 being implanted subsequent to provision of sidewall spacers 90 and graded junction regions 74 and 86 being implanted prior to provision of sidewall spacers 90.

The net result of the steps shown in FIGS. 2–6 is to create a peripheral NMOS having source/drain regions 102, halo regions 86, and LDD regions 74, and to further create an array of NMOS memory device transistors having source/drain regions 76. Thus, the net result of the processing of FIGS. 2–6 is to create a peripheral NMOS transistor device 101 and an array of NMOS memory transistor devices 103.

The memory transistors 103 and peripheral NMOS transistor 101 are next typically further processed by: (1) deposition of a nitride or oxide cap over transistors 101 and 103 to block borophosphosilicate glass (BPSG) out-diffusion; (2) BPSG deposition over transistors 101 and 103; (3) the formation of contact openings to the source/drain regions of transistors 101 and 103; and (4) the provision of conductive plugs within the contact openings to form ohmic contacts with the source/drain regions.

A problem with the processing of FIGS. 3–6 is that the shown two separate masking steps (the masking steps of FIGS. 4 and 6) are utilized between the formation of the peripheral NMOS LDD region 74 (shown in FIG. 3) and the implant of source/drain regions 102 (shown in FIG. 6) during the formation of the peripheral NMOS transistor 101. As each masking step carries with it a risk of mask misalignment, it would be desirable to eliminate at least one of the masking steps. Also, and perhaps more importantly, as the cost of forming an integrated circuit increases as the number of masking steps is increased, it would be desirable to eliminate at least one of the masking steps.

Although the above discussion of prior art was limited toward applications in which the PMOS transistor gate and NMOS transistor gates were patterned concurrently (a so-called "non-split-poly" process), similar masking steps, and associated desirability of eliminating masking steps, occur in applications in which a PMOS transistor gate is patterned non-concurrently with the NMOS transistor gates (the so-called "split-poly" processes). A prior art split-poly process is described with reference to FIGS. 7–12.

Referring to FIG. 7, a semiconductor wafer fragment 240 is illustrated at a processing step in accordance with the prior art. Fragment 240 comprises a portion of a semiconductor material wafer 42, which is preferably the same type of semiconductor material as discussed previously regarding FIGS. 2–6. The shown wafer fragment 240 is subdivided into three defined regions: PMOS region 244 (only a portion of which is shown), peripheral NMOS region 246, and memory array region 248 (only a portion of which is shown). Regions 244 and 246 together comprise a defined peripheral region 250 (only a portion of which is shown).

The semiconductor material of wafer 42 within peripheral NMOS region 246 and memory array region 248 is typically polysilicon lightly doped with a p-type impurity. The semiconductor material of wafer 42 within PMOS region 244 is typically polysilicon comprising a well 252 which is lightly doped with an n-type impurity.

A series of field oxide regions 262 are provided on top of wafer 42. Between field oxide regions 262, and over a top surface 261 of wafer 42, is provided a gate oxide layer 266. Over gate oxide layers 266 and over field oxide regions 262 is provided a gate layer 253. Gate layer 253 typically comprises a polysilicon layer 268, a refractory metal layer 270, an upper oxide layer 271 and a cap 272.

Referring to FIG. 8, gate layer 253 is patterned over peripheral NMOS and memory array regions 246 and 248, while leaving layer 253 unpatterned over PMOS region 244. Accordingly, a series of transistor gates, 256, 258 and 260, are formed over regions 246 and 248 while leaving an unpatterned gate layer strip 251 over region 244. Also patterned is a word line 264 (only a portion of which is shown) over one of the field oxide regions of memory array region 248.

Gate 256 corresponds to a peripheral NMOS transistor gate and gates 258 and 260 correspond to memory array NMOS transistor gates. The gates, as well as word line 264, all comprise a gate oxide layer 266, a polysilicon layer 268, a refractory metal layer 270, an upper oxide layer 271, and a cap 272; structures which were described previously regarding transistor device 14. Also, each of gates 256, 258 and 260, as well as word line 264, comprise opposing lateral sidewalls 263.

Referring to FIG. 9, n-type regions 274 and 276 are implanted into peripheral and memory NMOS regions 246 and 248, respectively. Regions 274 are peripheral NMOS LDD regions implanted operatively adjacent peripheral NMOS gate 256, while regions 276 are memory array source/drain regions implanted operatively adjacent memory array NMOS gates 258 and 260. As the memory array source/drain regions 276 are typically implanted at a dopant concentration and depth comparable to the peripheral NMOS LDD regions 274, regions 274 and 276 are typically implanted during a common implant step.

After the implant of regions 274 and 276, the polysilicon of gates 256, 258 and 260, word line 264, upper surface 261 and unpatterned gate layer strip 251 is oxidized to form silicon oxide layer 280.

Referring to FIG. 10, a first masking layer provision step occurs as memory array region 248 is covered with a masking layer 282, preferably of photoresist. Subsequently, a p-type dopant 284 is implanted into peripheral NMOS region 246 to form peripheral NMOS halo regions 286 operatively adjacent peripheral NMOS gate 256. The PMOS region 244 is typically not covered by masking layer 282, as the cap layer 272 of unpatterned gate layer strip 251 is typically thick enough to effectively inhibit penetration of dopant 284 into the material beneath the cap layer 272.

Halo regions 286 are displaced further from gate 256 than LDD regions 274 as a result of LDD regions 274 being implanted prior to formation of oxide layer 280 and halo regions 286 being implanted subsequent to formation of oxide layer 280.

Referring to FIG. 11, masking layer 282 is removed. Subsequently, sidewall spacers 288, 290, 292, 294 and 296 are provided adjacent unpatterned gate layer strip 251, gates 256, 258 and 260, and word line 264, respectively. The sidewall spacers over the memory array region 248 will ultimately function to electrically insulate word line 264 from the memory devices encompassing memory transistors 258 and 260. The sidewall spacers over peripheral NMOS region 246, i.e., sidewall spacers 290, will ultimately function to space peripheral NMOS source/drain regions outwardly from gate 256 relative the graded junction regions 274 and 286, as shown in FIG. 12.

Referring to FIG. 12, a second masking layer provision step occurs as memory array region 248 is again masked, this time with a masking layer 298, preferably of photoresist. Subsequently, n-type dopant 300 is implanted into peripheral NMOS region 246 to form peripheral NMOS source/drain regions 302 operatively adjacent peripheral NMOS gate 256. As alluded to above with reference to FIG. 11, source/drain regions 302 are displaced further from gate 256 than graded junction regions 274 and 286 as a result of the use of sidewall spacers 290. More specifically, source/drain regions 302 are displaced further outward from gate 256 than regions 274 and 286 because regions 302 were implanted subsequent to the provision of the sidewall spacers 290 whereas regions 274 and 286 were implanted prior to provision of the sidewall spacers 290.

The net result of the processing of FIGS. 7–12 is to create a peripheral NMOS transistor device 301, an array of insulated NMOS memory transistor devices 303 and an insulated word line 307. The peripheral NMOS device 301 further comprising source/drain regions 302, halo regions 286, and LDD regions 274; and the array of NMOS memory device transistors 303 further comprising source/drain regions 276.

The memory transistors 303 and peripheral NMOS transistor 301 are next typically further processed by: (1) deposition of a silicon nitride or silicon oxide cap over transistors 301 and 303 to block borophosphosilicate glass (BPSG) out-diffusion; (2) BPSG deposition over transistors 301 and 303; (3) the formation of contact openings to the source/drain regions of transistors 301 and 303; and (4) the provision of conductive plugs within the contact openings to form ohmic contacts with the source/drain regions. Also, a PMOS transistor would typically be provided over PMOS region 244 by patterning unpatterned masking layer strip 251 to form a transistor gate and then providing source/drain regions, and possibly graded junction regions, operatively adjacent the transistor gate. The formed PMOS transistor and one or more of the NMOS transistors could be utilized in formation of CMOS circuitry.

A problem with the prior art processing sequence of FIGS. 7–12 is that two separate masking layer provision steps are utilized between the formation of the peripheral NMOS LDD region 274 (shown in FIG. 9) and the implant of source/drain regions 302 (shown in FIG. 12) which completes formation of the peripheral NMOS transistor device 301. As each masking layer provision step carries with it a risk of mask misalignment, it would be desirable to eliminate at least one of these two steps. Also, and perhaps more importantly, as the cost of forming an integrated circuit increases as the number of masking layer provision steps is increased, it would be desirable to eliminate at least one of these two steps.

BRIEF DESCRIPTION OF THE DRAWINGS

Preferred embodiments of the invention are described below with reference to the following accompanying drawings.

FIG. 13 is a view of the FIG. 2 wafer fragment shown at a processing step in accordance with one embodiment of the invention, shown at a processing step subsequent to that of FIG. 2.

FIG. 14 is a view of the FIG. 2 wafer shown at a processing step subsequent to that of FIG. 13.

FIG. 24 is a view of the FIG. 2 wafer fragment shown at a processing step subsequent to that of FIG. 23.

FIG. 25 is a view of the FIG. 2 wafer fragment shown at a processing step subsequent to that of FIG. 24.

FIG. 26 is a view of the FIG. 7 wafer fragment shown at a processing step in accordance with a fourth embodiment of the invention, shown at a processing step subsequent to that of FIG. 8.

FIG. 27 is a view of the FIG. 7 wafer shown at a processing step subsequent to that of FIG. 26.

FIG. 30 is a view of the FIG. 7 wafer fragment shown at a processing step subsequent to that of FIG. 8 in accordance with a fifth embodiment of the invention.

FIG. 31 is a view of the FIG. 7 wafer fragment shown at a processing step subsequent to that of FIG. 29.

FIG. 38 is a view of the FIG. 7 wafer fragment shown at a processing step subsequent to that of FIG. 37.

DETAILED DESCRIPTION OF THE PREFERRED EMBODIMENTS

Figure 1:
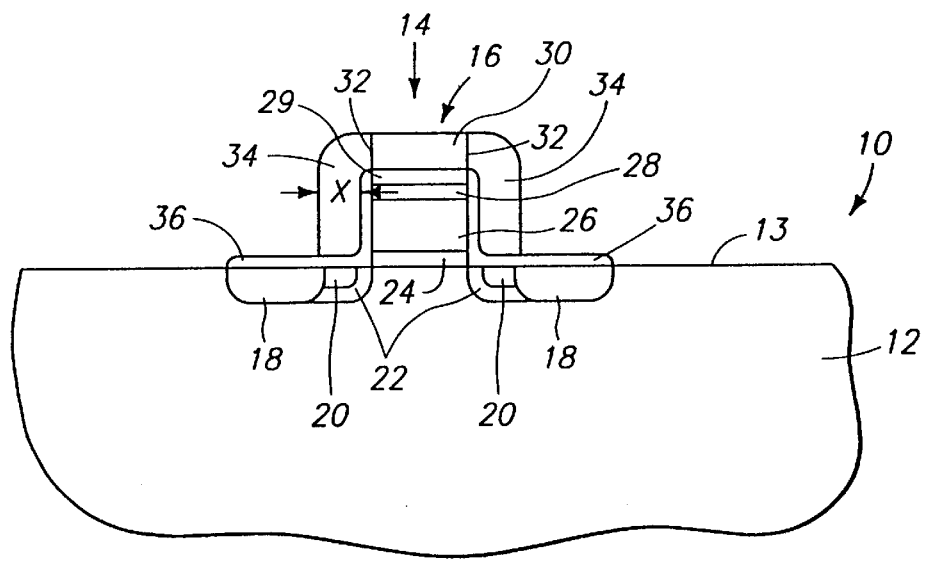
FIG. 1 is a diagrammatic fragmentary sectional view of a prior art semiconductor wafer fragment illustrating a transistor device known in the art.

This disclosure of the invention is submitted in furtherance of the constitutional purposes of the U.S. Patent Laws "to promote the progress of science and useful arts" (Article 1, Section 8).

In one aspect, the invention is a method for implanting graded junction regions into a peripheral NMOS transistor and source/drain regions into a memory array of NMOS transistors, the method comprising the following steps:
providing a semiconductor material wafer;
defining a memory array region of the wafer;
defining a PMOS region and a peripheral NMOS region of the wafer;
providing a PMOS transistor gate over the PMOS region, providing a peripheral NMOS transistor gate over the peripheral NMOS region, and providing an array of memory NMOS transistor gates over the memory array region, the transistor gates having opposing lateral sidewalls;
providing sidewall spacers adjacent the sidewalls of the transistor gates, the sidewall spacers having a lateral thickness and comprising a sidewall spacer material;
providing a masking layer over the PMOS region and over the memory array region;
after providing the masking layer over the PMOS region and the memory array region, and after providing the sidewall spacers adjacent the peripheral NMOS transistor gate, implanting an n-type conductivity-enhancing dopant into the semiconductor wafer to form electrically conductive peripheral NMOS source/drain regions within the semiconductor material operatively adjacent the peripheral NMOS transistor gate;
after forming the electrically conductive NMOS source/drain regions, etching the sidewall spacer material adjacent the peripheral NMOS transistor gate to remove only a portion of said spacer material and to thereby decrease the lateral thickness of the sidewall spacers adjacent the peripheral NMOS transistor gate; and
after decreasing the lateral thickness of the sidewall spacers adjacent the peripheral NMOS transistor gate, implanting p-type conductivity-enhancing dopant into the semiconductor material to form halo regions operatively adjacent the peripheral NMOS source/drain regions.

In another aspect, the invention is a method for forming graded junction regions operatively adjacent a transistor gate, the method comprising the following steps:
providing a semiconductor material wafer;
providing a transistor gate over the semiconductor material wafer, the transistor gate having opposing lateral sidewalls;
providing sidewall spacers adjacent the sidewalls of the transistor gate, the sidewall spacers having a lateral thickness and comprising a sidewall spacer material;
after providing the sidewall spacers, implanting a first conductivity-enhancing dopant into the semiconductor wafer to form electrically conductive source/drain regions within the semiconductor material operatively adjacent the transistor gate;
after forming the electrically conductive source/drain regions, etching the sidewall spacer material to remove only a portion of said spacer material and to thereby decrease the lateral thickness of the sidewall spacers; and
after decreasing the lateral thickness of the sidewall spacers, implanting a second conductivity-enhancing dopant into the semiconductor material to form graded junction regions operatively adjacent the source/drain regions.

In yet another aspect, the invention is a semiconductor transistor device comprising:
a region of a semiconductor material wafer;
a transistor gate over a portion of the region of the semiconductor material wafer, the transistor gate having opposing lateral sidewalls;
opposing source/drain regions operatively adjacent the transistor gate, each source/drain region having an inner lateral boundary;
opposing sidewall spacers adjacent the sidewalls of the transistor gate, each sidewall spacer having an outer lateral edge, the sidewall spacers and source/drain regions being paired such that the outer lateral edges of the sidewall spacers are displaced laterally inwardly relative to the inner lateral boundaries of the source/drain regions; and
lateral gaps, the lateral gaps extending from the outer lateral edges of the sidewall spacers to the inner lateral boundaries of the source/drain regions.

In yet another aspect, the invention is a method for forming graded junction regions operatively adjacent a transistor gate of CMOS circuitry, the method comprising the following steps:

providing a semiconductor material wafer;

defining a PMOS region and an NMOS region of the wafer;

providing a gate layer over the PMOS region and over the NMOS region;

patterning the gate layer over the NMOS region to form an NMOS transistor gate over the NMOS region while leaving the gate layer over the PMOS region unpatterned, the NMOS transistor gate having opposing lateral sidewalls;

providing sidewall spacers adjacent the sidewalls of the NMOS transistor gate, the sidewall spacers having a lateral thickness and comprising a sidewall spacer material;

after providing the sidewall spacers, forming electrically conductive NMOS source/drain regions within the semiconductor material operatively adjacent the NMOS transistor gate;

after forming the electrically conductive NMOS source/drain regions, etching the sidewall spacer material adjacent the NMOS transistor gate to remove only a portion of said spacer material and to thereby decrease the lateral thickness of the sidewall spacers; and after decreasing the lateral thickness of the sidewall spacers adjacent the NMOS transistor gate, implanting conductivity-enhancing dopant into the semiconductor material to thereby form NMOS graded junction regions operatively adjacent the NMOS source/drain regions.

More specifically, the invention pertains to semiconductor transistor devices, to methods of forming such transistor devices, and to methods for forming graded junction regions within such devices. The invention is thought to have particular pertinence to areas of integrated device formation wherein a peripheral NMOS transistor device is formed in conjunction with an array of memory NMOS devices. A first embodiment of the invention is described with reference to FIGS. 13–16.

Figure 2:
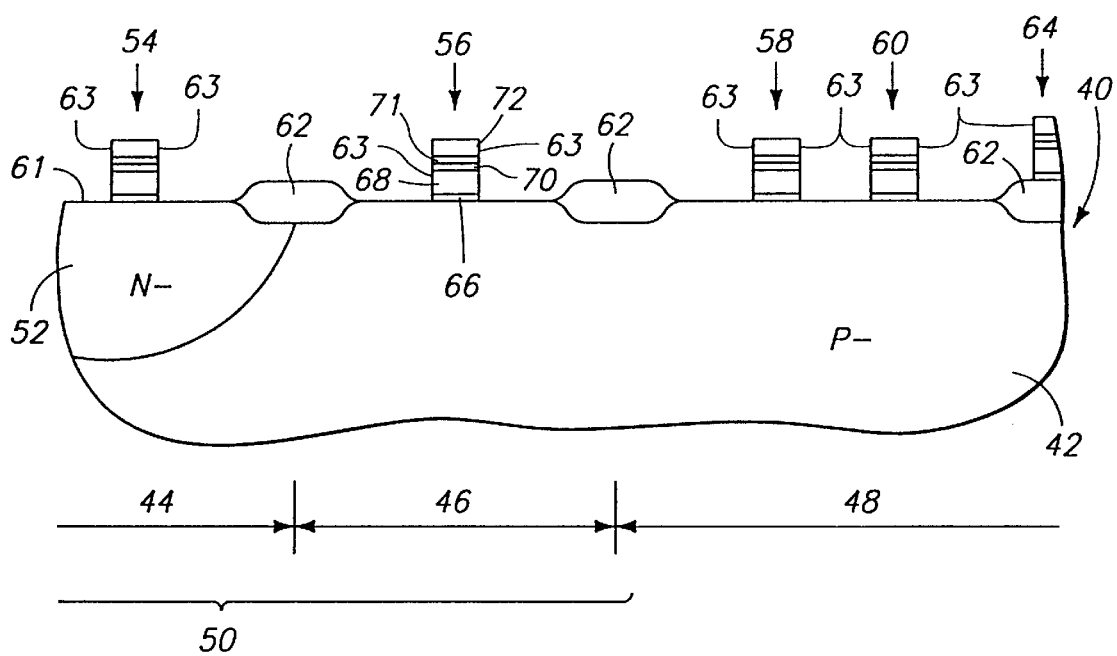
FIG. 2 is a diagrammatic fragmentary sectional view of a semiconductor wafer fragment at one processing step in accordance with a prior art processing method.
Figure 3:
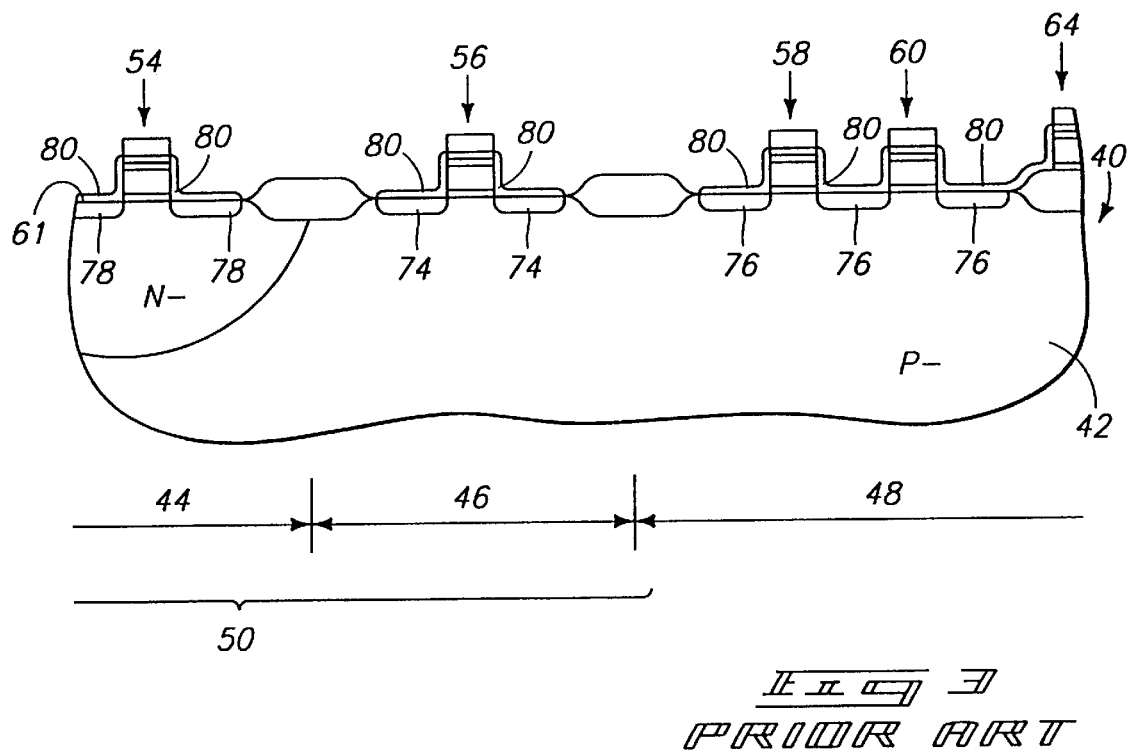
FIG. 3 is a view of the FIG. 2 wafer shown at a processing step subsequent to that shown in FIG. 2.

Referring first to FIG. 13, a semiconductor wafer fragment 40 is shown at a processing step subsequent to that of the prior art step of FIG. 2. The semiconductor wafer fragment 40 of FIG. 13 is actually identical to the wafer fragment 40 of FIG. 3, and is generally produced by the prior art methods described above regarding FIG. 3. Accordingly, wafer fragment 40 of FIG. 13 comprises defined PMOS, peripheral NMOS, and memory array regions 44, 46 and 48, as well as a defined peripheral region 50. Wafer fragment 40 further comprises a polysilicon semiconductor material wafer 42 above which is provided a PMOS transistor gate 54, a peripheral NMOS transistor gate 56, NMOS memory array transistor gates 58 and 60, and a word line 64. The gates and word line comprise a gate oxide layer 66, a polysilicon layer 68, a refractory metal layer 70, an upper oxide layer 71, and a cap layer 72. Cap layer 72 is preferably silicon nitride, and preferably has a vertical thickness "Z" of from about 1500 Angstroms to about 4500 Angstroms, with 3000 Angstroms being most preferred.

The FIG. 13 wafer further comprises peripheral NMOS and PMOS LDD regions 74 and 78, as well as memory NMOS source/drain regions 76. Also, gates 54, 56, 58 and 60 comprise opposing lateral sidewalls 63. A silicon oxide layer 80 extends along the polysilicon sidewalls of gates 54, 56, 58 and 60, as well as along an upper surface 61 of wafer 42.

Referring to FIG. 14, sidewall spacers 88, 90, 92, 94 and 96 are provided adjacent sidewalls 63 of transistor gates 54, 56, 58 and 60, as well as adjacent word line 64. Methods for provision of such sidewall spacers are known to persons of ordinary skill in the art.

Sidewall spacers 88, 90, 92, 94 and 96 comprise a sidewall spacer material and a lateral thickness "X". As discussed above regarding the prior art FIG. 1, the sidewall spacer material will preferably be silicon nitride, and thickness "X" will preferably be from about 200 Angstroms to about 1000 Angstroms as measured at about the level of refractory metal layer 70.

Figure 15:
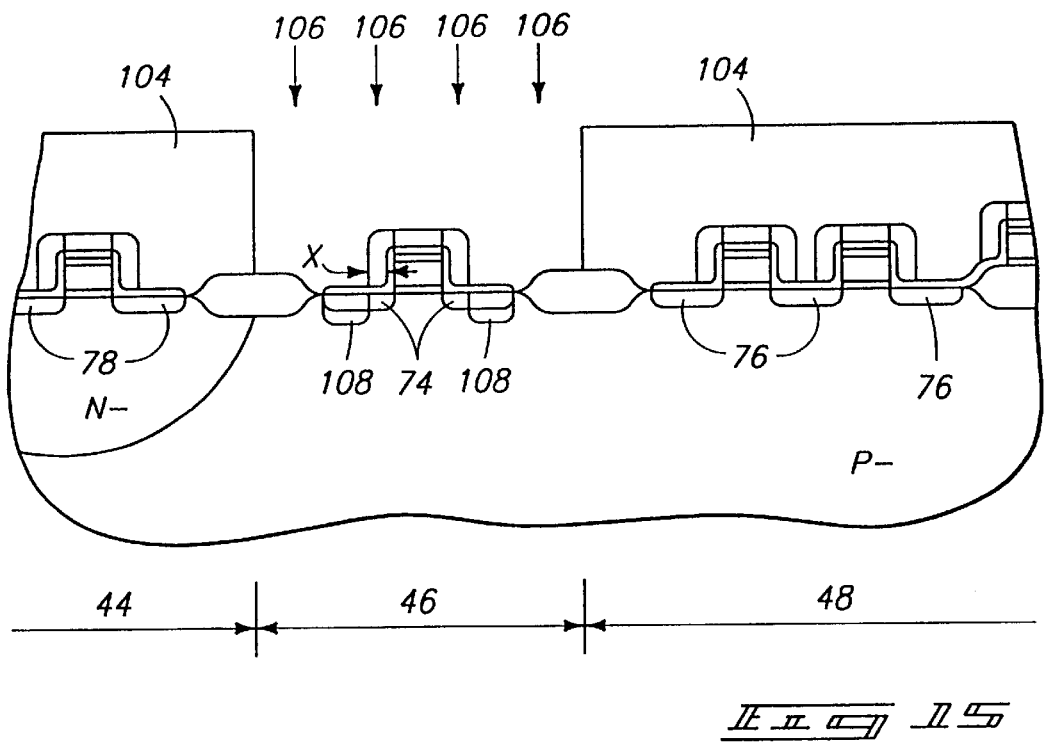
FIG. 15 is a view of the FIG. 2 wafer fragment shown at a step subsequent to that of FIG. 14.

Referring to FIG. 15, a masking layer provision step occurs as PMOS and memory array regions 44 and 48 are covered with a masking layer 104, preferably of photoresist. Subsequently, an n-type conductivity enhancing dopant 106 is implanted into semiconductor material wafer 42 to form electrically conductive NMOS source/drain regions 108 within the semiconductor material water. N-type conductivity enhancing dopant 106 will preferably comprise arsenic and will preferably be implanted at a dose of from about $1\times10^{15}$ atoms/cm$^2$ to about $4\times10^{15}$ atoms/cm$^2$ and at an energy of from about 10 KeV to about 50 KeV.

Figure 16:
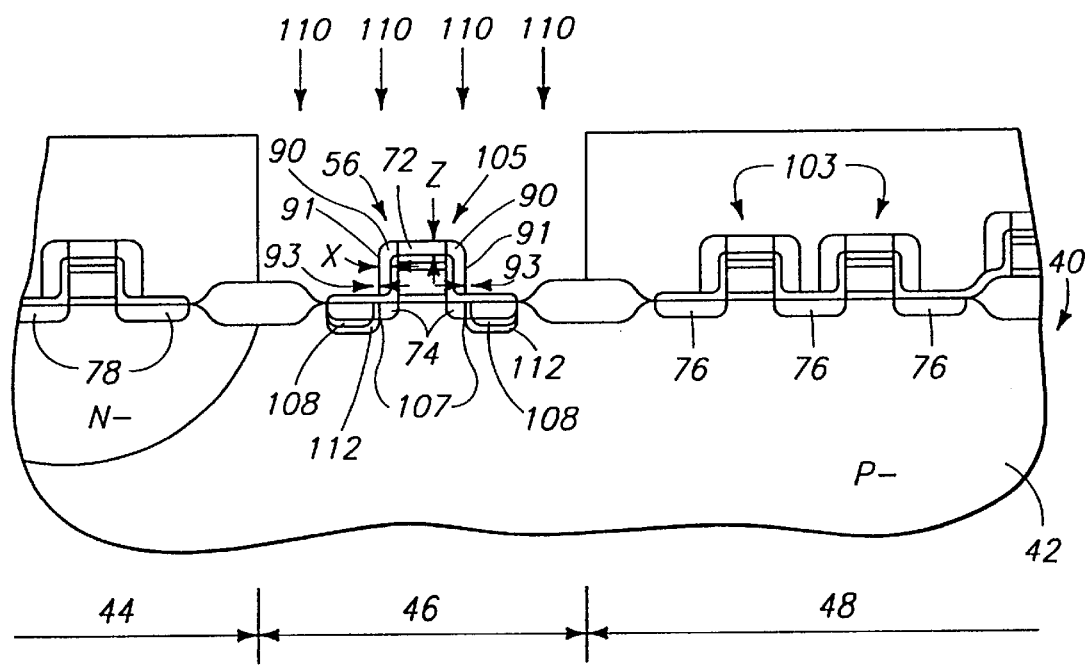
FIG. 16 is a view of the FIG. 2 wafer fragment shown at a step subsequent to that of FIG. 15.

Referring to FIG. 16, the thickness "X" of sidewall spacers 90 is decreased by removing sidewall spacer material from the spacers 90. Preferably; such removal is accomplished with an isotropic etch. Most preferably, the isotropic etch is a high pressure reactive ion etch utilizing NF$_3$, He, and O$_2$. Also preferably, the thickness "X" will be decreased by 10 to 90% of its original value. Most preferably, the original value of thickness "X" will be about 700 Angstroms and the thickness will be decreased by about 400 Angstroms or 57% by the etch. However, the sidewall spacer material of sidewalls 90 may also be completely removed, as discussed in more detail below in regard to FIG. 32, to thereby expose the oxide layer 80 adjacent gate 56. It is noted that, since cap layer 72 is formed from silicon nitride, the etch of sidewall spacers 90 will also decrease the horizontal thickness "Z" of layer 72. Preferably, the original thickness "Z" of layer 72 will be substantially more than the original thickness "X" of spacers 90. For instance, if spacers 90 have an original thickness "X" of 700 Angstroms, cap layer 72 will preferably have an original thickness "Z" of about 3000 Angstroms so that capping layer 72 is not lost during the etch of sidewalls 90.

After the etch of sidewalls 90, a p-type conductivity enhancing dopant 110 is implanted into semiconductor material wafer 42 to form peripheral NMOS halo regions 112. P-type conductivity enhancing dopant 110 will preferably comprise boron. Most preferably, p-type dopant 110 will be BF$_2$ and will be implanted at a dose of from about $5\times10^{12}$ atoms/cm$^2$ to about $5\times10^{13}$ atoms/cm$^2$ and at an energy of from about 10 KeV to about 100 KeV.

Figure 4:
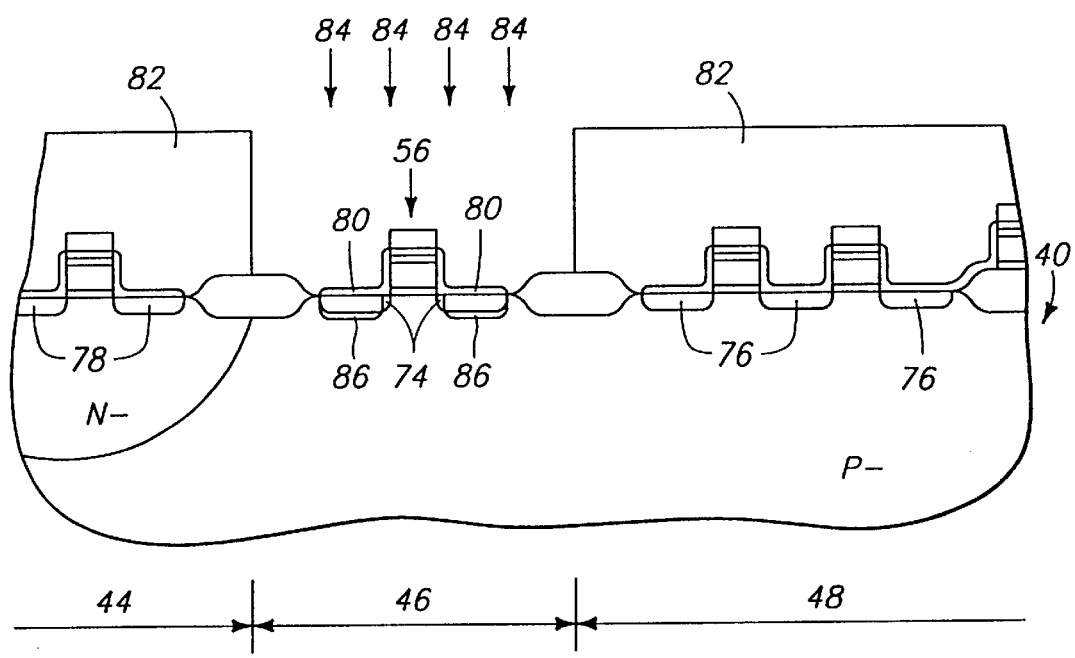
FIG. 4 is a view of the FIG. 2 wafer shown at a processing step subsequent to that of FIG. 3.
Figure 5:
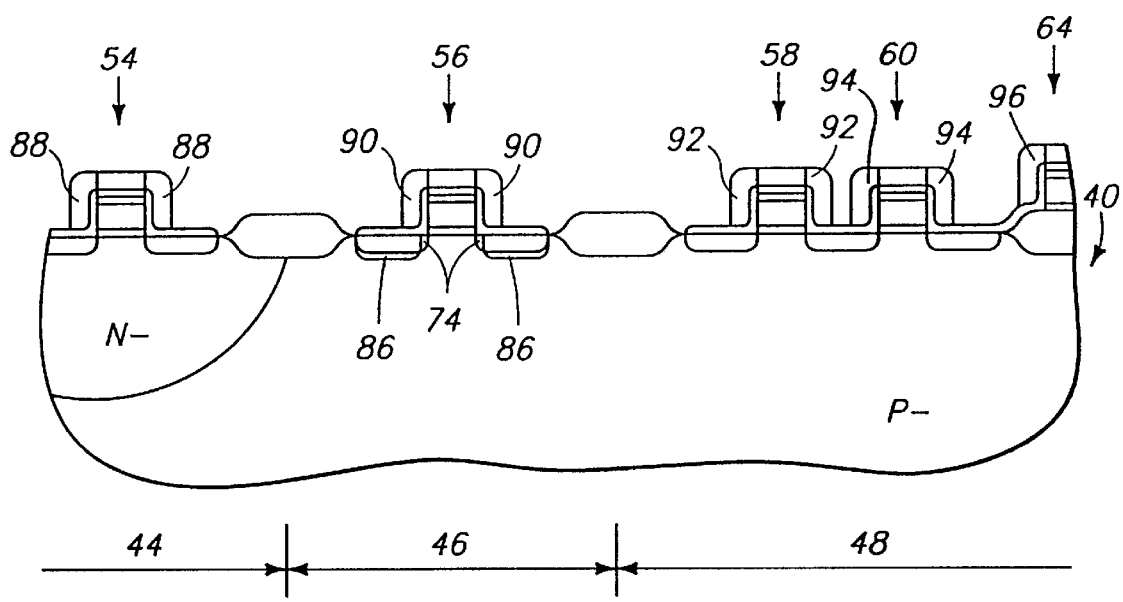
FIG. 5 is a view of the FIG. 2 wafer shown at a step subsequent to that of FIG. 4.

The process of FIGS. 13–16 forms a peripheral NMOS transistor By device 105 and an array of NMOS memory transistor devices 103. Transistors 105 and 103 are functionally comparable integrated devices to the devices 101 and 103 formed by the prior art process of FIGS. 2–6, but were formed with one less masking layer provision step. The prior art process of FIGS. 2–6 utilizes two masking layer provision steps, shown at FIGS. 4 and 6, after the provision of the peripheral NMOS LDD region 74 (shown in FIG. 3), and prior to a last implant of dopant (the implant of dopant 100) which completes transistors 101 and 103. In contrast, the process of FIGS. 13–16 utilizes only the one masking layer provision step, shown at FIG. 15, after the provision of the peripheral NMOS LDD region 74 (shown in FIG. 13), and prior to a last implant of dopant (the implant of dopant 110) which completes transistors 105 and 103. Yet, both processes result in the formation of a peripheral NMOS, either 101 or 105, with source/drain regions, halo regions and LDD regions, as well as in the formation of an array of NMOS memory transistors 103 with source/drain regions.

Figure 6:
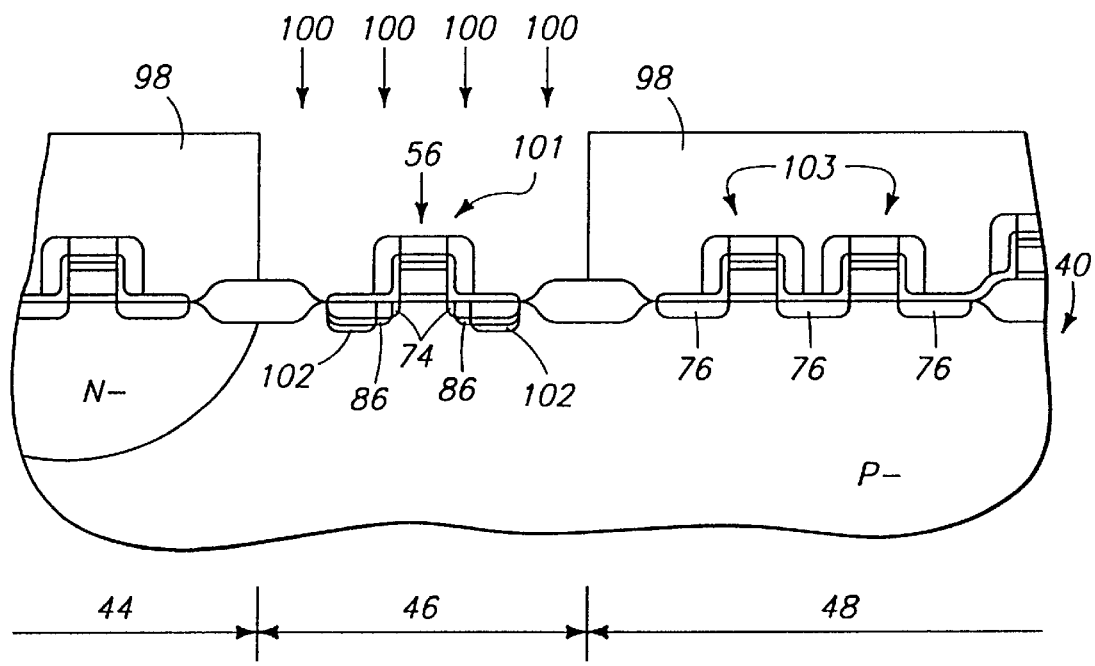
FIG. 6 is a view of the FIG. 2 wafer shown at a step subsequent to that of FIG. 5.
Figure 7:
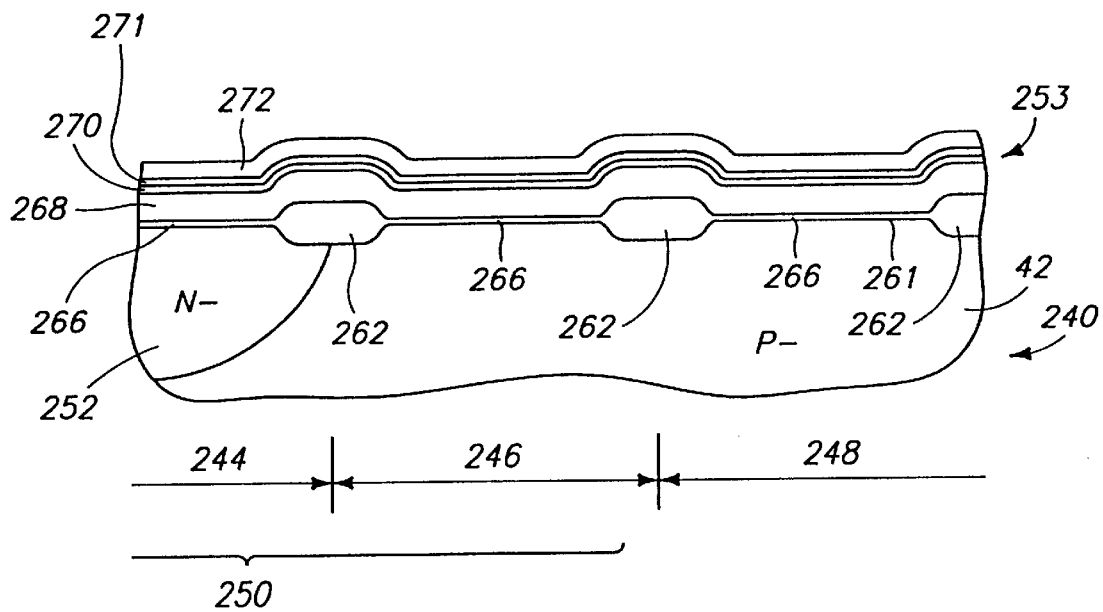
FIG. 7 is a diagrammatic fragmentary sectional view of a semiconductor wafer fragment at one processing step in accordance with a prior art processing method.

A difference between the transistor device 105 formed by the process of FIGS. 13–16 and the prior art transistor devices, such as exemplified by the devices 14 in FIG. 1 and 101 in FIG. 6, is in the location of the source/drain regions relative to the sidewall spacers. The sidewall spacers 90 of transistor device 105 have outer lateral edges 91 which are displaced laterally inwardly relative to an inner lateral boundary 107 of source/drain regions 108. Thus, a lateral gap 93 exists between the outer lateral edge 91 of sidewall spacer 90 and the inner lateral boundary 107 of source/drain regions 108. No such lateral gaps exists in prior art transistor devices 14 and 101.

The length of lateral gap 93 will be approximately equal to the amount by which the lateral thickness "X" of sidewall spacers 90 is decreased subsequent to the formation of source/drain regions 108. For instance, in the most preferable aspect of the invention discussed above with reference to FIG. 16, the lateral thickness "X" is decreased by about 400 Angstroms after formation of source/drain regions 108. In such a most preferable aspect of the invention, the length of the lateral gap 93 in the resulting transistor device 105 will also be about 400 Angstroms. Preferably, the length of lateral gap 93 will be from about 150 Angstroms to about 600 Angstroms.

As shown in FIG. 16, the lateral gap 93 essentially provides a slit or pocket for implanting graded junction regions 112 inwardly adjacent to source/drain regions 108. Thus, in the shown preferred aspect of the invention, the lateral gap 93 within wafer 42 comprises a graded junction region 112 which is inwardly adjacent source/drain regions 108.

The process of the present invention may be further utilized in completing formation of a PMOS transistor over PMOS region 44 as described with reference to FIGS. 17 and 18.

Figure 17:
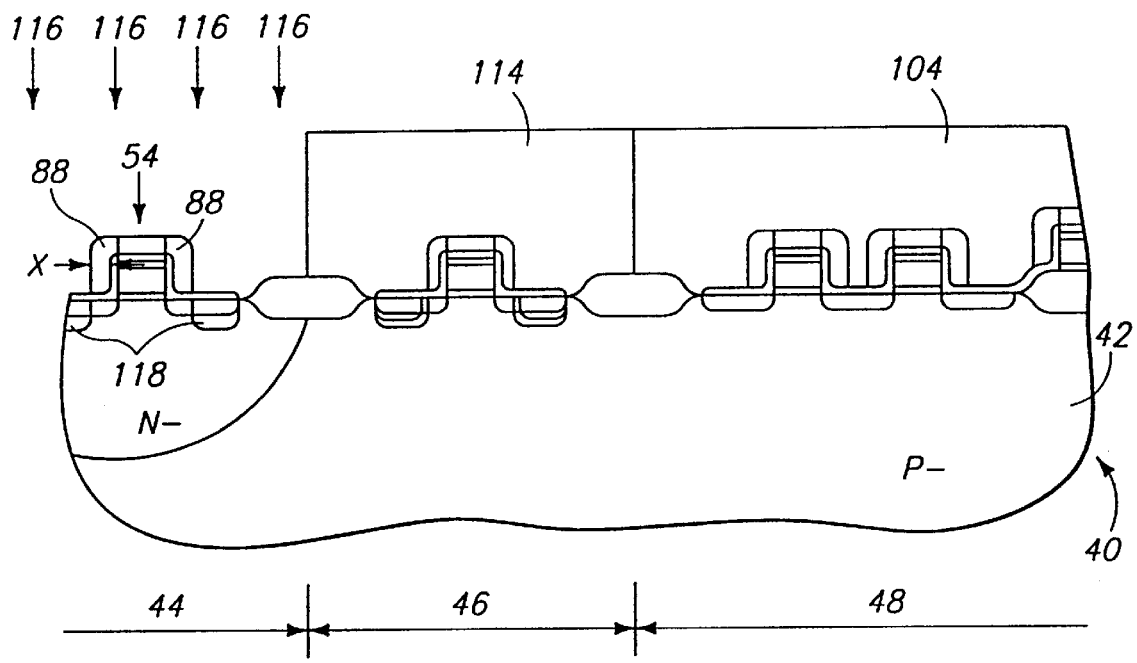
FIG. 17 is a view of the FIG. 2 wafer fragment shown at a step subsequent to that of FIG. 16.

Referring to FIG. 17, masking layer 104 is stripped from over PMOS region 44 and a masking layer 114 is provided over peripheral NMOS region 46. Next, a p-type conductivity enhancing dopant 116 is implanted into the semiconductor material wafer 42 to form PMOS source/drain regions 118 operatively adjacent PMOS gate 54. P-type conductivity enhancing dopant 116 preferably comprises boron. Most preferably, p-type dopant 116 comprises $BF_2$ and is implanted at a dose of from about $1\times10^{15}$ atoms/cm$^2$ to about $5\times10^{15}$ atoms/cm$^2$ and at an energy of from about 10 KeV to about 40 KeV.

Figure 18:
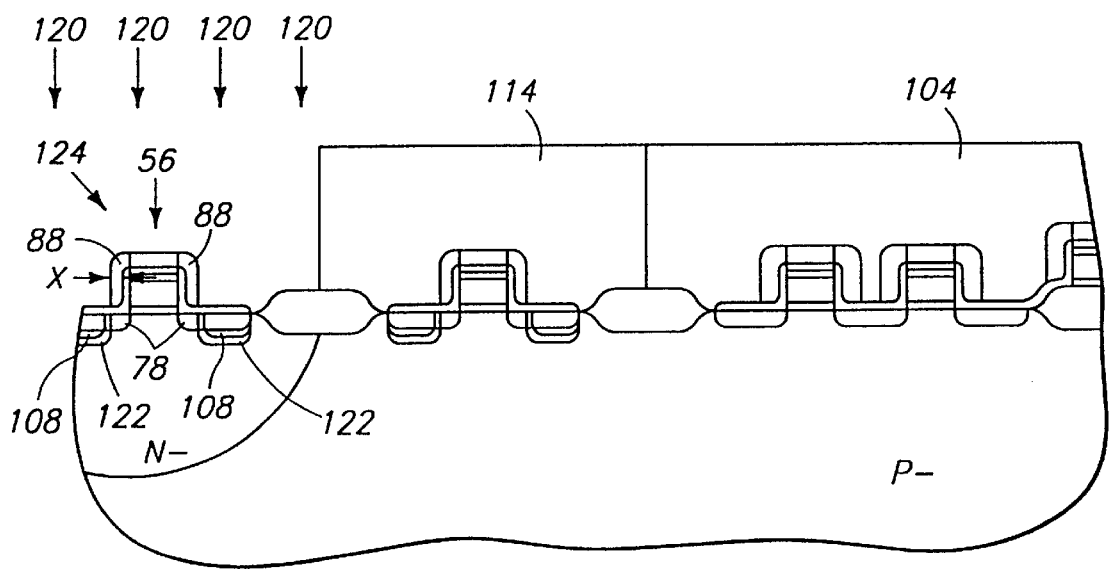
FIG. 18 is a view of the FIG. 2 wafer fragment shown at a step subsequent to that of FIG. 17.

Referring to FIG. 18, the lateral thickness "X" of spacers 88 is reduced by removing spacer material. Preferably, this removal of spacer material comprises the same preferable conditions described above with reference to FIG. 16.

After decreasing the lateral thickness "X" of sidewall spacers 88, n-type dopant 120 is implanted into wafer 42 to form PMOS halo regions 122. The n-type dopant 120 preferably comprises phosphorus and is preferably implanted at a dose of from about $1\times10^{12}$ atoms/cm$^2$ to about $5\times10^{13}$ atoms/cm$^2$ and at implant energy of from about 30 KeV to about 70 KeV.

The formation of halo regions 122 completes formation of a PMOS transistor 124 comprising PMOS gate 54, source/drain regions 118, LDD regions 78, and halo regions 122.

In combination, processing steps 13–18 of the present invention produce the PMOS transistor device 124, the peripheral NMOS transistor device 105, and the NMOS memory transistor devices 103. An alternate embodiment of the present invention is described with reference to FIGS. 19, 20 and 21.

Figure 19:
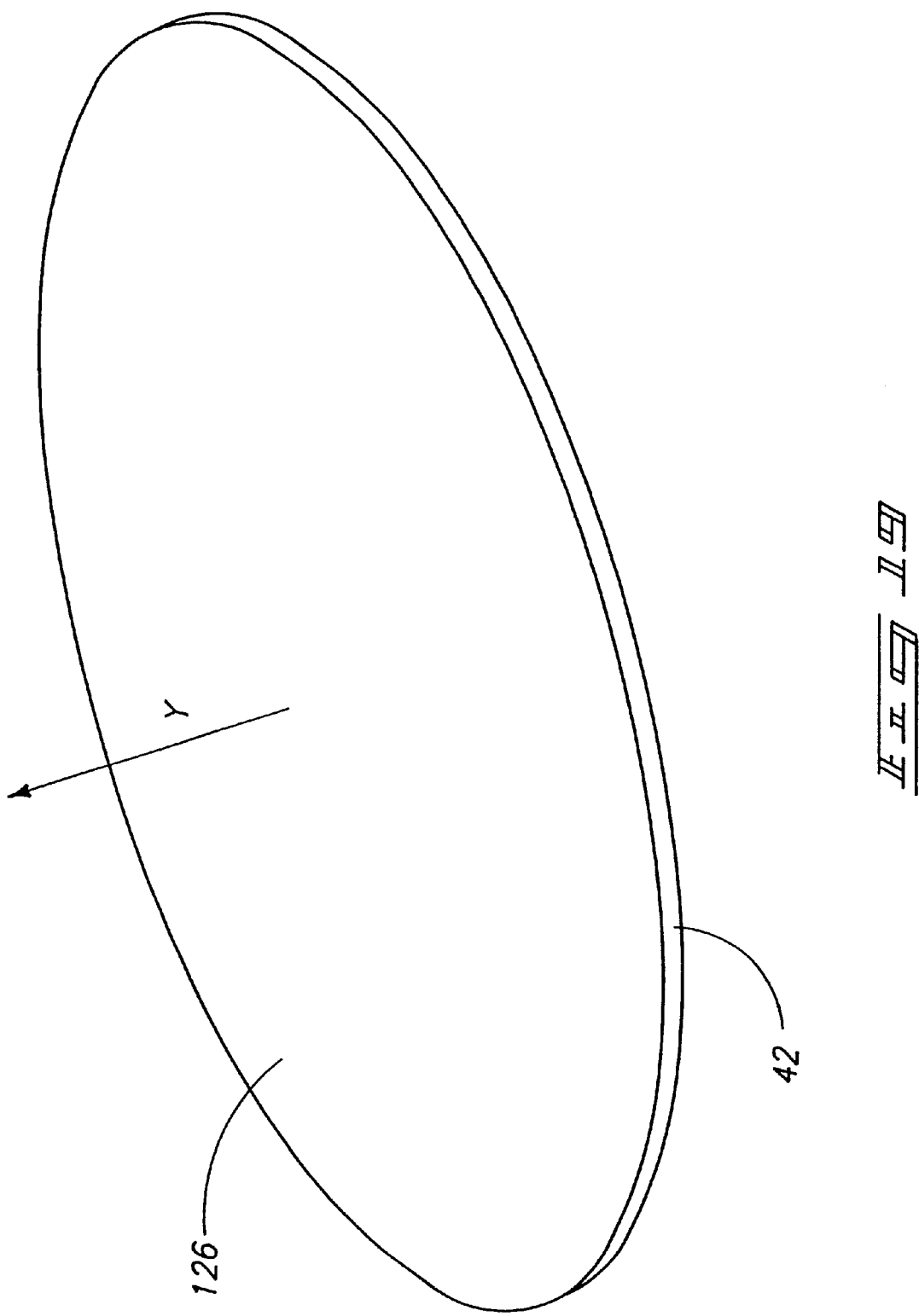
FIG. 19 is an isometric view of a semiconductor wafer.

Referring to FIG. 19, semiconductor wafer material 42, when viewed from a distance, has an overall planar configuration which establishes a virtual planar top surface 126 and an axis "Y" normal to virtual planar top surface 126. It is to be understood that virtual planar top surface 126 is an imaginary surface. The virtual surface 126 is defined as the apparently flat surface of a semiconductor wafer material which appears when the wafer is viewed from a distance. Thus, virtual surface 126 exists regardless of whether the actual top surface 61 (shown, for example, in FIG. 13) of semiconductor material wafer 42 contains crevasses, protrusions, or devices, such as would result from prior semiconductor processing steps.

Figure 20:
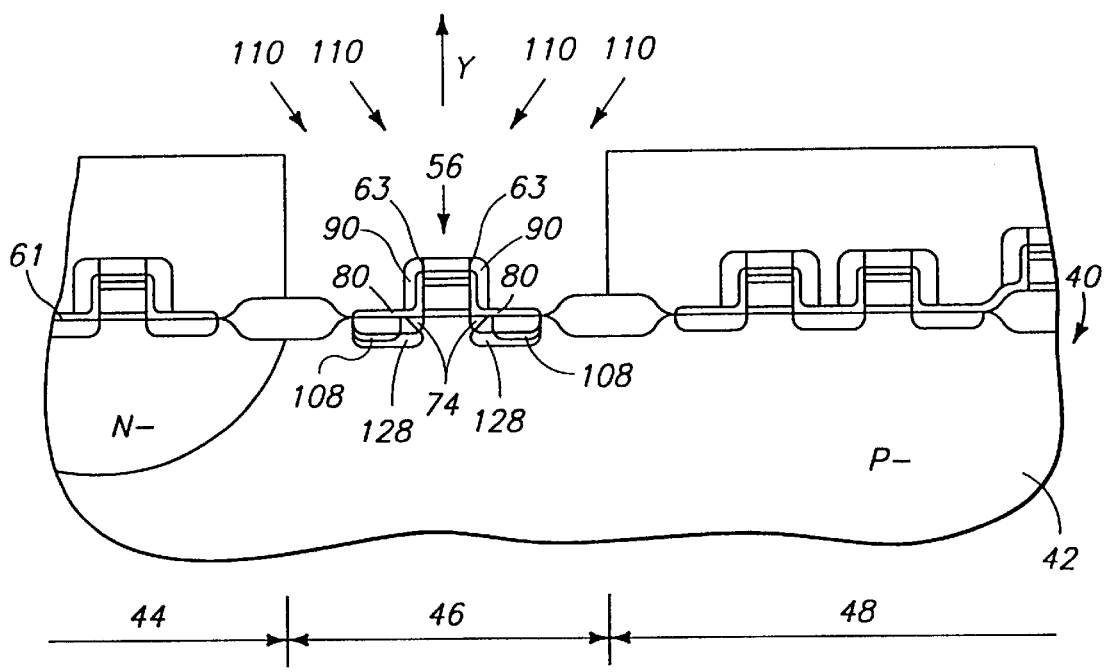
FIG. 20 is a view of the FIG. 2 wafer fragment shown at a step subsequent to that of FIG. 15 in accordance with a second embodiment of the invention.

Referring to FIG. 20, wafer fragment 40 is shown at a processing step subsequent to that of FIG. 15. In FIG. 20, the lateral thickness "X" of opposing lateral sidewalls 90 has been decreased in a process similar to that described with reference to FIG. 16. Also, in FIG. 20 the p-type dopant 110 is implanted into semiconductor material wafer 42 to form NMOS halo regions in a manner similar to that described with reference to FIG. 16. However, the embodiment of FIG. 20 differs from that of FIG. 16 in that dopant 110 is implanted at an angle other than parallel to the axis "Y" normal to the virtual planar top surface 126 (shown in FIG. 19) of semiconductor wafer material 42. Due to the angled implant of dopant 110, the resulting peripheral NMOS halo implant regions 128 are toed slightly inward and may actually penetrate beneath silicon oxide layer 80 adjacent gate sidewalls 63, and may even penetrate beneath the gate 56.

For the angled implant of FIG. 20, p-type dopant 110 is preferably $BF_2$ and is preferably implanted at a dose of from about $1\times10^{12}$ atoms/cm$^2$ to about $1\times10^{13}$ atoms/cm$^2$ and at an energy of from about 20 KeV to about 120 KeV.

Figure 21:
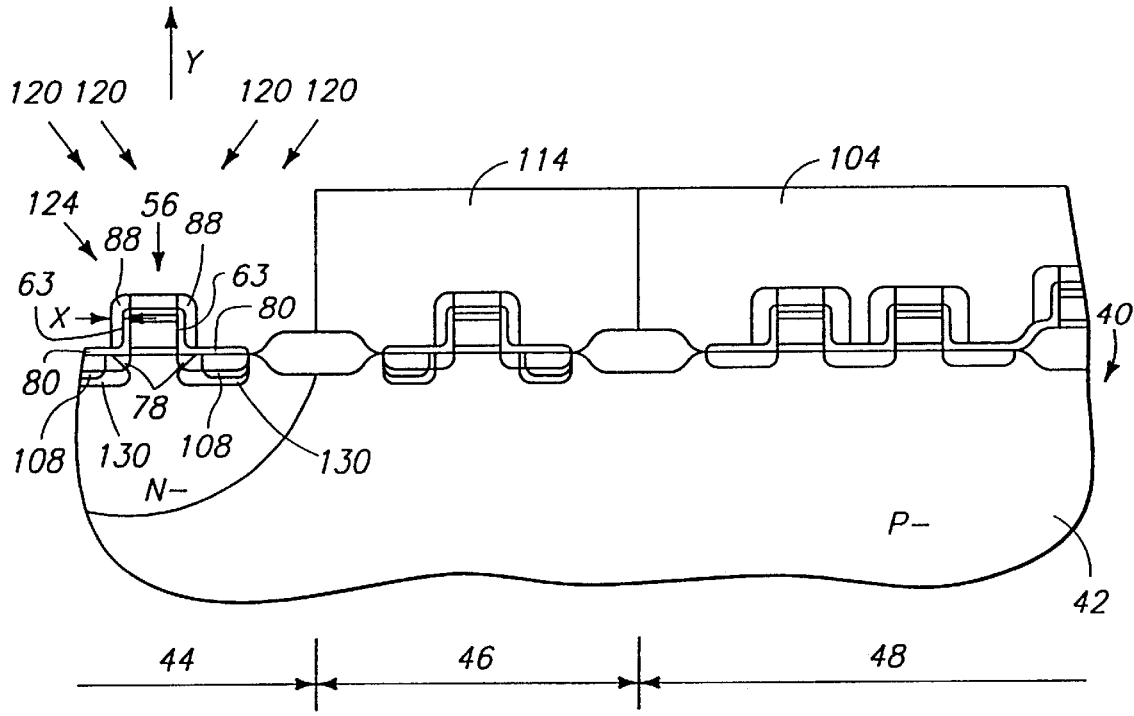
FIG. 21 is a view of the FIG. 2 wafer fragment shown at a step subsequent to that of FIG. 17 in accordance with the second embodiment of the invention.

Referring to FIG. 21, wafer fragment 40 is shown at a processing step subsequent to that of FIG. 17. Sidewall spacers 88 have been reduced in lateral thickness "X", preferably by the methods discussed above with reference to FIG. 18. The difference between FIG. 21 and FIG. 18 is that in FIG. 21 the n-type conductivity enhancing dopant 120 is implanted at an angle other than parallel to the axis "Y" normal to the virtual planar surface 126 (shown in FIG. 19) of semiconductor material wafer 42 to form PMOS halo implant regions 130. Due to the angled implant of dopant 120, halo implants 130 are toed inward toward transistor gate 54 and may in fact penetrate beneath oxide layer 80 adjacent sidewalls 63 of gate 54, and may even penetrate beneath gate 54 itself.

For the angled implant of FIG. 21, dopant 120 is preferably phosphorus and is preferably implanted at a dose of from about $1\times10^{12}$ atoms/cm$^2$ to about $1\times10^{13}$ atoms/cm$^2$ and at an energy of from about 20 KeV to about 120 KeV.

A further embodiment of the invention is described with reference to FIGS. 22–25.

Figure 22:
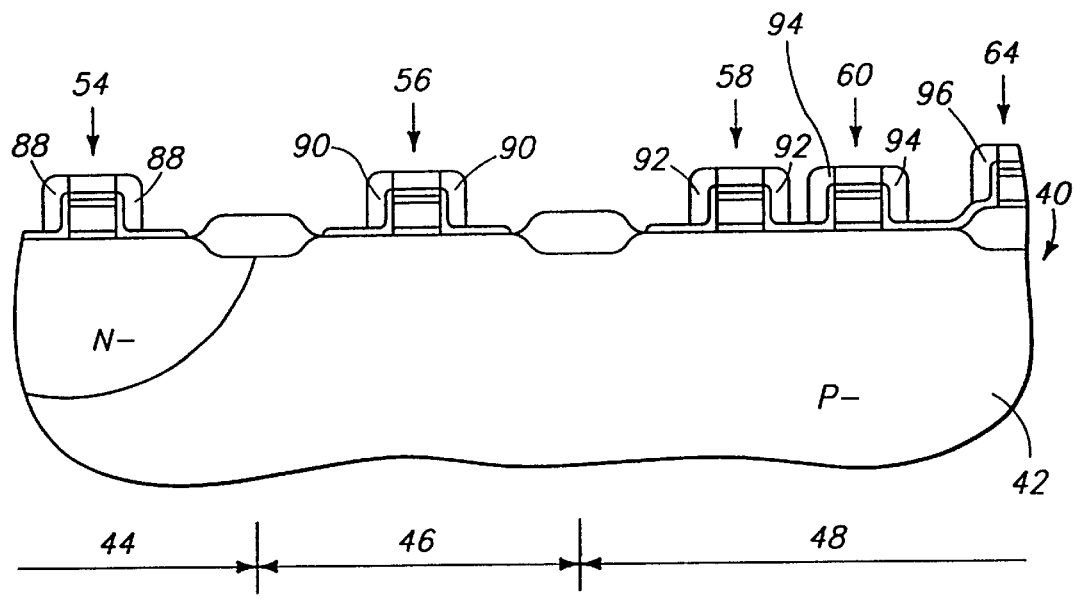
FIG. 22 is a view of the FIG. 2 wafer fragment shown at a processing step in accordance with a third embodiment of the invention.

Referring to FIG. 22, a semiconductor wafer fragment 40 is shown subsequent to the processing step of FIG. 2. Silicon oxide layers 80 are formed and sidewall spacers 88, 90, 92, 94 and 96 are provided adjacent gates 54, 56, 58 and 60, as well as adjacent word line 64.

Figure 23:
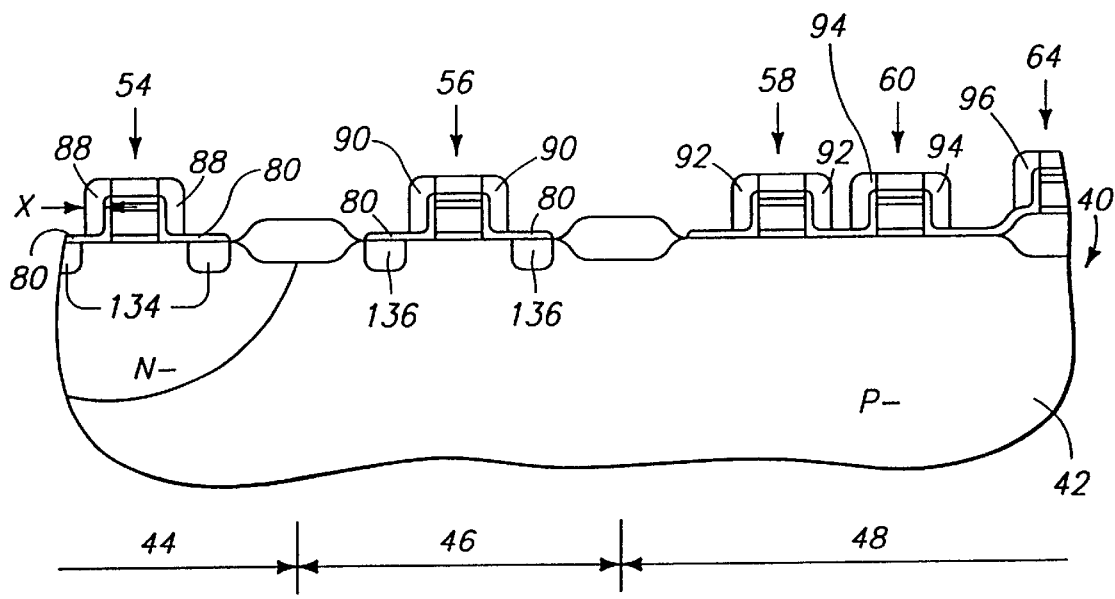
FIG. 23 is a view of the FIG. 2 wafer fragment shown at a step subsequent to that of FIG. 22.

Referring to FIG. 23, PMOS source/drain regions 134 and NMOS source/drain regions 136 are provided adjacent PMOS gate 54 and peripheral NMOS gate 56, respectively. Methods for forming source/drain regions 134 and 136 are known to persons of ordinary skill in the art. Generally, such methods would comprise: (1) masking memory array region 48 and PMOS region 44 while implanting an n-type dopant into region 46 to form source/drain regions 136; (2) stripping the masking layer from over the NMOS region 46; (3) masking NMOS region 46 and memory array region 48 while implanting a p-type dopant into PMOS region 44 to form source/drain regions 134; and (4) stripping the masking layer from over the PMOS region 44.

Referring to FIG. 24, the lateral thickness "X" of sidewall spacers 88, 90, 92, 94 and 96 has been reduced, preferably by an etching step such as the etching step described above with reference to FIG. 16. Subsequent to the reduction of lateral thickness "X", an n-type conductivity enhancing dopant 138 is implanted into semiconductor material wafer 42 to form PMOS halo regions 140, peripheral NMOS LDD regions 142, and memory array source/drain regions 144. In the shown embodiment, dopant 138 is implanted at an angle other than parallel to the axis "Y" normal to virtual planar surface 126 of semiconductor wafer material 42 (shown in FIG. 19). Such an angled implant of dopant 138 may improve the penetration of dopant 138 beneath sidewall spacers 88, 90, 92 and 94. However, in a less preferred aspect of the invention, dopant 138 could also be implanted at an angle parallel to axis "Y". Preferably dopant 138 is phosphorus and is implanted under either the conditions described above with reference to FIG. 18, or under the conditions described with reference to FIG. 21.

Referring to FIG. 25, a masking layer 132, preferably of photoresist, is provided over memory array region 48. Subsequently a p-type dopant 142 is implanted into PMOS region 44 and peripheral NMOS region 46 to form PMOS LDD regions 145 operatively adjacent PMOS gate 54 and to form peripheral NMOS halo regions 146 operatively adjacent NMOS gate 56. For reasons similar to those discussed above regarding FIG. 24, dopant 142 is preferably implanted at an angle to axis "Y" as shown. However, in a less preferred aspect of the invention, the dopant may also be implanted parallel to axis "Y". Preferably dopant 142 is $BF_2$ and is implanted under the either the conditions described above with reference to FIG. 17 or under the conditions described with reference to FIG. 20.

The embodiment of the invention shown in FIGS. 22–25 thus forms a PMOS transistor 148, a NMOS transistor 150, and memory array transistors 151 and 152.

The PMOS transistors, peripheral NMOS transistors, and memory array transistors formed by any of the embodiments described above may be further processed by: (1) deposition of a nitride or oxide cap over the transistors to block borophosphosilicate glass (BPSG) out-diffusion; (2) BPSG deposition over the transistors; (3) the formation of contact openings to the source/drain regions of the transistors; and (4) the provision of conductive plugs within the contact openings to form ohmic contacts with the source/drain regions.

It is to be understood that the invention is not to be limited by the embodiments shown in the drawings. For instance, silicon oxide layer 80 is shown as formed prior to the peripheral NMOS LDD regions and the memory array source/drain regions throughout the illustrated embodiments. However, silicon oxide layer 80 would not necessarily have to be formed at all, and would also not necessarily need to be formed prior to formation of any of the shown graded junction regions or source/drain regions.

Whereas the above-described embodiments were primarily directed toward application of the present invention to non-split-poly processes, the following embodiments, embodiments 4–8, are directed primarily toward application of the present invention to split-poly processes. The fourth embodiment of the invention is described with reference to FIGS. 26–29.

Figure 8:
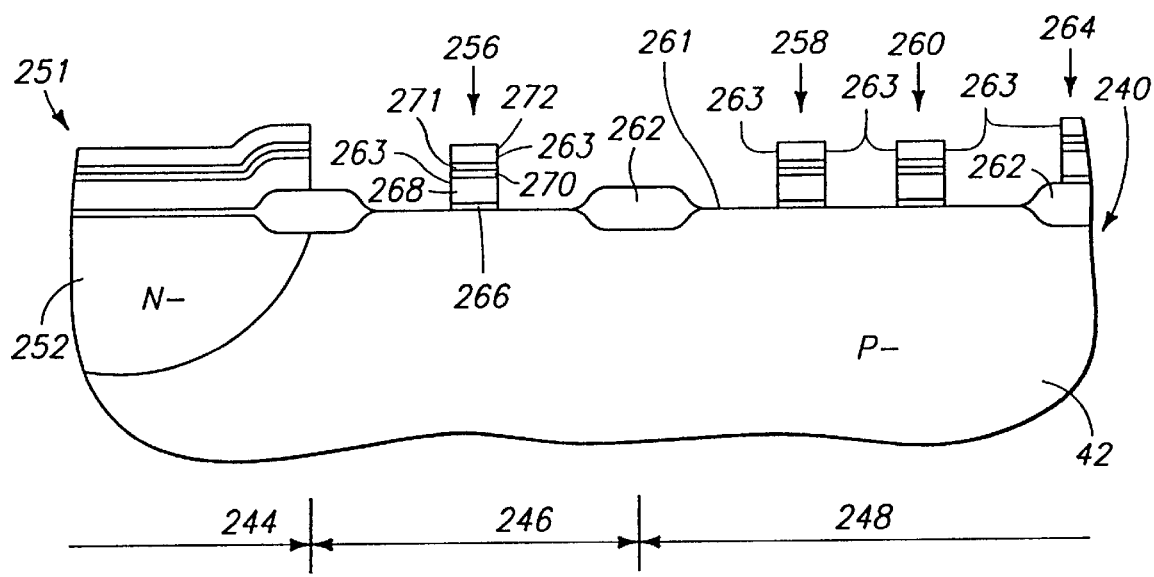
FIG. 8 is a view of the FIG. 7 wafer shown at a prior art processing step subsequent to that shown in FIG. 7.
Figure 9:
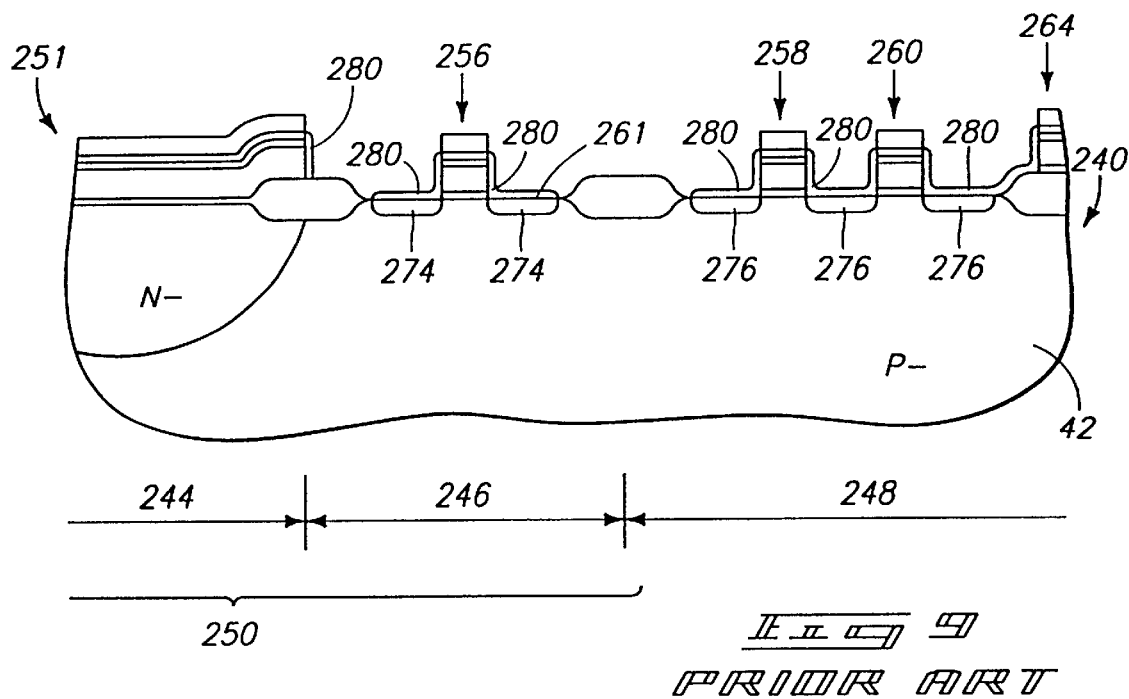
FIG. 9 is a view of the FIG. 7 wafer shown at a prior art processing step subsequent to that of FIG. 8.

Referring first to FIG. 26, a semiconductor wafer fragment 240 is shown at a processing step subsequent to that of the prior art step of FIG. 8. The semiconductor wafer fragment 240 of FIG. 26 is actually identical to the wafer fragment 240 of FIG. 9, and is generally produced by the prior art methods described above regarding FIG. 9. Accordingly, wafer fragment 240 of FIG. 26 comprises defined PMOS, peripheral NMOS, and memory array regions 244, 246 and 248, as well as a defined peripheral region 250. Wafer fragment 240 further comprises a polysilicon semiconductor material wafer 42 above which is provided an unpatterned gate layer strip 251, a peripheral NMOS transistor gate 256, NMOS memory array transistor gates 258 and 260, and a word line 264. The masking layer strip, gates and word line comprise a polysilicon layer 268, a refractory metal layer 270, an upper oxide layer 271, and a cap layer 272. Cap layer 272 is preferably silicon nitride, and preferably has a vertical thickness "Z" of from about 1500 Angstroms to about 4500 Angstroms, with 3000 Angstroms being most preferred. The gates and word line further comprise a gate oxide layer 266.

The FIG. 26 wafer further comprises peripheral NMOS LDD region 274, and memory NMOS source/drain regions 276. Also, gates 256, 258 and 260, as well as word line 264 comprise opposing lateral sidewalls 263. A silicon oxide layer 280 extends along the polysilicon sidewalls of unpatterned gate layer strip 251, gates 256, 258 and 260, word line 264, and along an upper surface 261 of wafer 42.

Referring to FIG. 27, sidewall spacers 288, 290, 292, 294 and 296 are provided adjacent sidewalls 263 of transistor gates 256, 258 and 260, as well as adjacent masking layer strip 251 and word line 264. Methods for provision of such sidewall spacers are known to persons of ordinary skill in the art.

Sidewall spacers 288, 290, 292, 294 and 296 comprise a sidewall spacer material and a lateral thickness "X". As discussed above regarding the prior art FIG. 1, the sidewall spacer material will preferably be silicon nitride, and thickness "X" will preferably be from about 200 Angstroms to about 1000 Angstroms, as measured at about the level of refractory metal layer 270.

Figure 28:
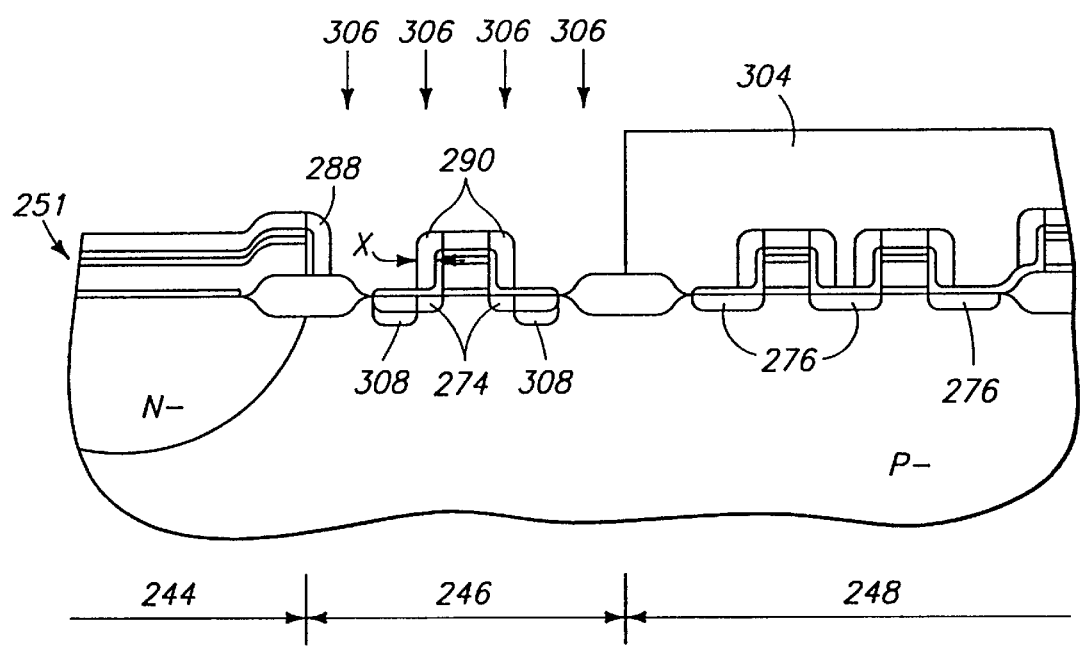
FIG. 28 is a view of the FIG. 7 wafer fragment shown at a processing step subsequent to that of FIG. 27.

Referring to FIG. 28, a masking layer provision step occurs as memory array region 248 is covered with a masking layer 304. Preferably, masking layer 304 is photoresist. Subsequently, an n-type conductivity enhancing dopant 306 is implanted into semiconductor material wafer 42 to form electrically conductive NMOS source/drain regions 308 within the semiconductor material wafer. N-type conductivity enhancing dopant 306 will preferably comprise arsenic and will preferably be implanted at a dose of from about $1\times10^{15}$ atoms/cm$^2$ to about $4\times10^{15}$ atoms/cm$^2$ and at an energy of from about 10 KeV to about 50 KeV.

Figure 29:
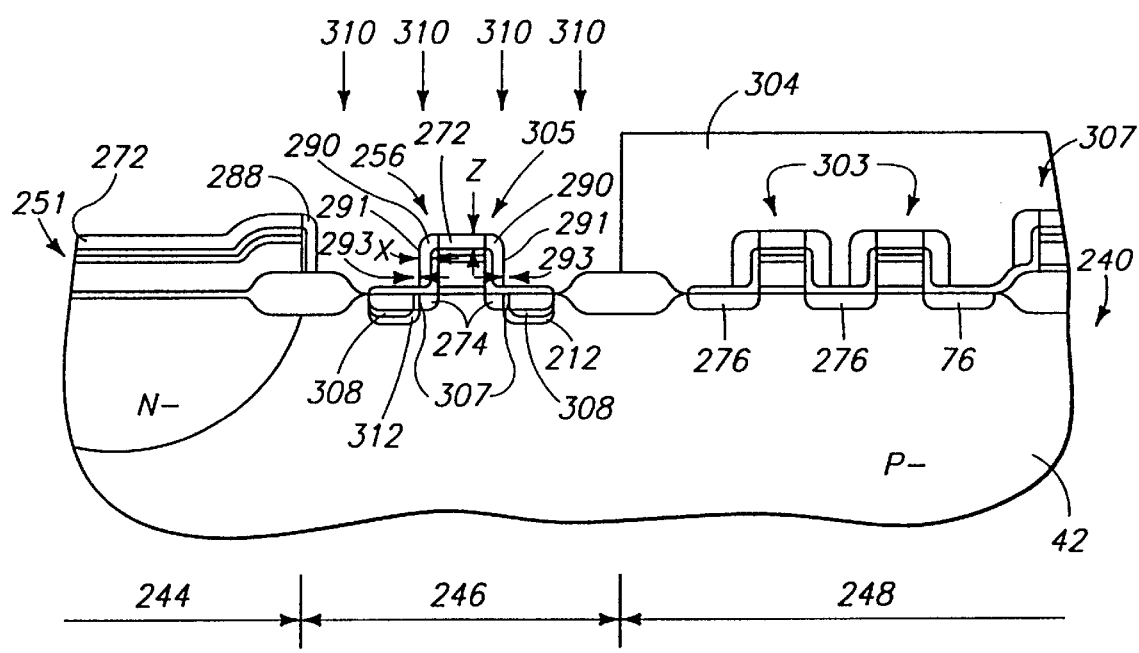
FIG. 29 is a view of the FIG. 7 wafer fragment shown at a processing step subsequent to that of FIG. 28.

Referring to FIG. 29, the thickness "X" of sidewall spacers 290 is decreased by removing sidewall spacer material from the spacers 290. The thickness "X" may even be reduced to zero, i.e., the spacers 290 entirely removed, as discussed below with reference to FIG. 32.

Preferably, the removal of the sidewall spacer material is accomplished with an isotropic etch. Most preferably, the isotropic etch comprises a high pressure reactive ion etch utilizing $NF_3$, He, and $O_2$. It is noted that, since cap layer 272 is formed from silicon nitride, the etch of sidewall spacers 290 will also decrease the horizontal thickness "Z" of layer 272.

As sidewall spacer 288 and cap layer 272 of masking strip 251 are exposed to the above-described spacer etch, the thickness of sidewall spacers 288 and cap layer 272 of masking strip 251 are also reduced by the etch.

After the etch of sidewalls 290, a p-type conductivity enhancing dopant 310 is implanted into semiconductor material wafer 42 to form peripheral NMOS halo regions 312. P-type conductivity enhancing dopant 310 will preferably comprise boron. Most preferably, p-type dopant 310 will be $BF_2$ and will be implanted at a dose of from about $5\times10^{12}$ atoms/cm$^2$ to about $5\times10^{13}$ atoms/cm$^2$ and at an energy of from about 10 KeV to about 100 KeV.

The process of FIGS. 26–29 forms a peripheral NMOS transistor device 305, an array of NMOS memory transistor devices 303 and an insulated word line 307. Transistor devices 305 and 303 are functionally comparable to the devices 301 and 303 formed by the prior art process of FIGS. 7–12, but were formed with one less masking layer provision step.

Figure 10:
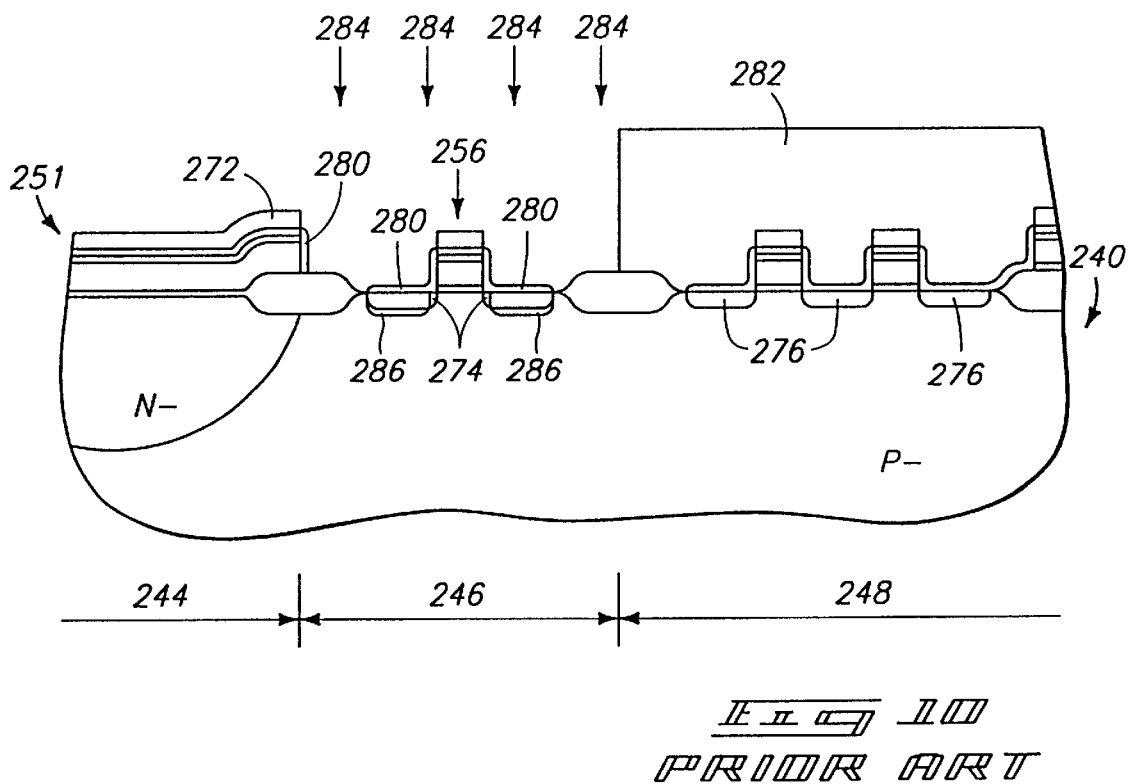
FIG. 10 is a view of the FIG. 7 wafer shown at a prior art processing step subsequent to that of FIG. 9.
Figure 11:
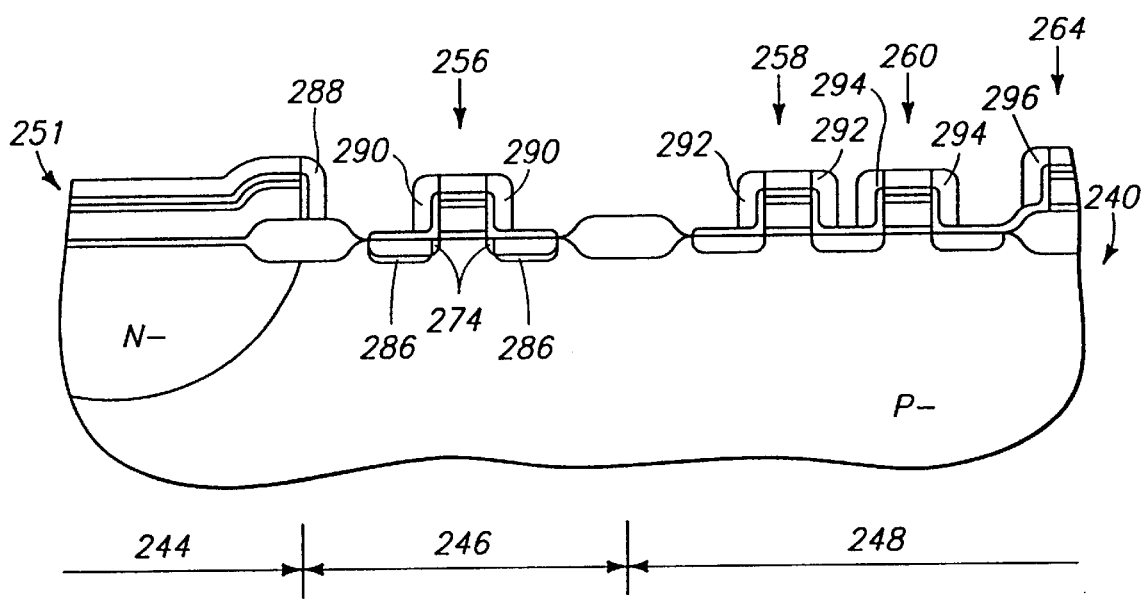
FIG. 11 is a view of the FIG. 7 wafer shown at a prior art processing step subsequent to that of FIG. 10.
Figure 12:
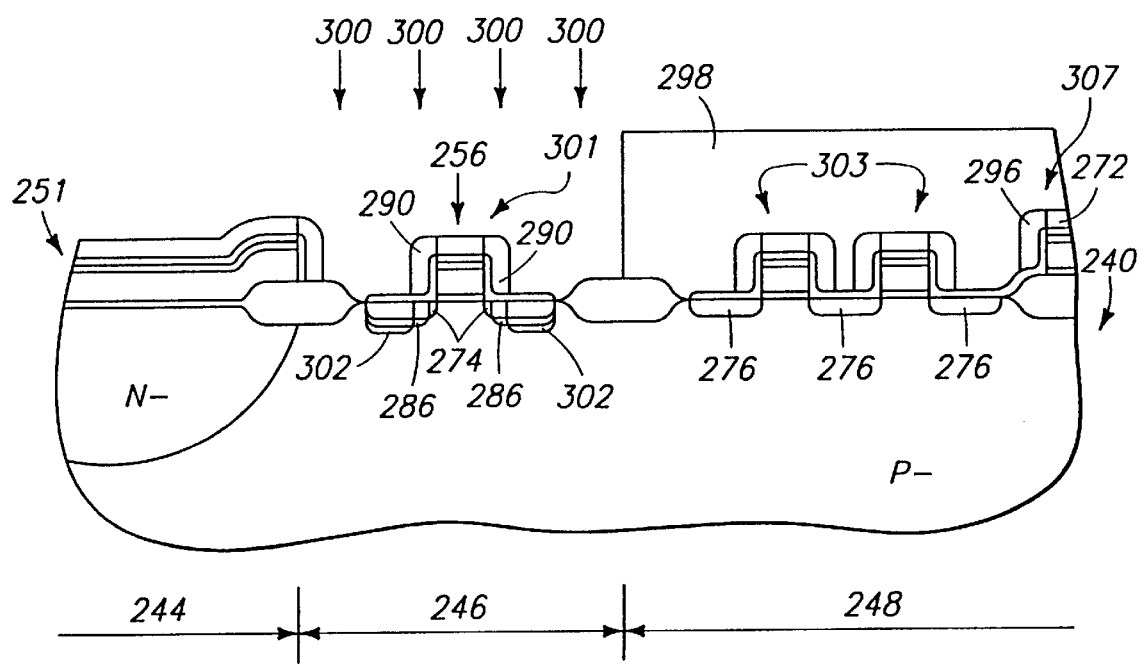
FIG. 12 is a view of the FIG. 7 wafer shown at a prior art processing step subsequent to that of FIG. 11.

The prior art process of FIGS. 7–12 utilizes the two masking layer provision steps, shown at FIGS. 10 and 12, after provision of the transistor gates 256, 258 and 260, and prior to the last implant of dopant (the implant of dopant 300) to complete transistor devices 301 and 303.

In contrast, the process of FIGS. 26–29 utilizes only the one masking layer provision step, shown at FIG. 28, after the provision of the transistor gates and prior to the last implant of dopant (the implant of dopant 310) to complete transistor devices 303 and 305.

Yet, both the prior art process of FIGS. 7–12 and the process of the present invention at FIGS. 26–29 form a peripheral NMOS, either 301 or 305, with source/drain regions, halo regions and LDD regions. Both processes also form of an array of NMOS memory transistors 303 with source/drain regions.

A difference between the transistor device 305 formed by the process of FIGS. 26–29 and the prior art transistor device 301 formed by the process of FIGS. 7–12, is in the location of the source/drain regions relative to the sidewall spacers. The sidewall spacers 290 of transistor device 305 have outer lateral edges 291 which are displaced laterally inwardly, i.e., closer to gate 256, relative to an inner lateral boundary 311 of source/drain regions 308. Thus, a lateral gap 293 exists between the outer lateral edge 291 of sidewall spacer 290 and the inner lateral boundary 311 of source/drain regions 308. No such lateral gap exists in prior art transistor device 301.

The length of lateral gap 293 is approximately equal to the amount by which the lateral thickness "X" of sidewall spacers 290 is decreased subsequent to the formation of source/drain regions 308. For instance, if the lateral thickness "X" is decreased by about 400 Angstroms after formation of source/drain regions 308, the length of the lateral gap 293 in the resulting transistor device 305 is also about 400 Angstroms. Preferably, the thickness "X" is reduced such that the length of lateral gap 293 will be from about 200 Angstroms to about 600 Angstroms.

As shown in FIG. 29, the lateral gap 293 essentially provides a slit or pocket for implanting graded junction regions 312 inwardly adjacent to source/drain regions 308, relative to gate 256. Thus, in the shown preferred aspect of the invention, the lateral gap 293 within wafer 42 comprises a graded junction region 312 which is inwardly adjacent source/drain regions 308.

A fifth embodiment of the present invention is described with reference to FIG. 30. In FIG. 30, wafer fragment 240 is shown at a processing step subsequent to that of FIG. 28.

In FIG. 30, the lateral thickness "X" of opposing lateral sidewalls 290 has been decreased in a process similar to that described with reference to FIG. 28. Also, in FIG. 30 the p-type dopant 310 is implanted into semiconductor material wafer 42 to form NMOS halo regions in a manner similar to that described with reference to FIG. 29. However, the embodiment of FIG. 30 differs from that of FIG. 29 in that dopant 310 is implanted at an angle other than parallel to the axis "Y" normal to the virtual planar top surface 126 (shown in FIG. 19) of semiconductor wafer material 42. Due to the angled implant of dopant 310, the resulting peripheral NMOS halo implant regions 328 are toed slightly inward and may actually penetrate beneath silicon oxide layer 280 adjacent gate sidewalls 263, and may even penetrate beneath the gate 256.

For the angled implant of FIG. 30, p-type dopant 310 is preferably $BF_2$ and is preferably implanted at a dose of from about $1\times10^{12}$ atoms/cm$^2$ to about $1\times10^{12}$ atoms/cm$^2$ and at an energy of from about 20 KeV to about 120 KeV.

After the formation of peripheral NMOS transistor device 305 and memory array transistor devices 303, a PMOS transistor device may be formed over PMOS region 244 as described with reference to FIG. 31. Referring to FIG. 31, wafer fragment 240 is shown at a processing step subsequent to that of FIG. 29. A masking layer 314, preferably of photoresist, is provided over peripheral NMOS region 246. Subsequently, a PMOS gate 330 is patterned from strip 251 (shown in FIG. 29) and thereafter oxide layers 332 and sidewall spacers 334 are provided adjacent the PMOS gate 330. Also, source/drain regions 336, halo regions 338 and LDD regions 340 are provided operatively adjacent gate 330, to form the shown PMOS transistor device 342. Methods for forming the shown device 342 are known to persons of ordinary skill in the art.

The wafer fragment 240 may be further processed by: (1) stripping masking layers 304 and 314 from over peripheral NMOS region 246 and memory array region 248; (2) deposition of a silicon nitride or silicon oxide cap over transistors 303, 305 and 342 to block borophosphosilicate glass (BPSG) out-diffusion; (3) BPSG deposition over transistors 303, 305 and 342; (4) the formation of contact openings to the source/drain regions of transistors 303, 305 and 342; and (5) the provision of conductive plugs within the contact openings to form ohmic contacts with the source/drain regions.

A sixth embodiment of the invention is described with reference to FIGS. 32–36.

Figure 32:
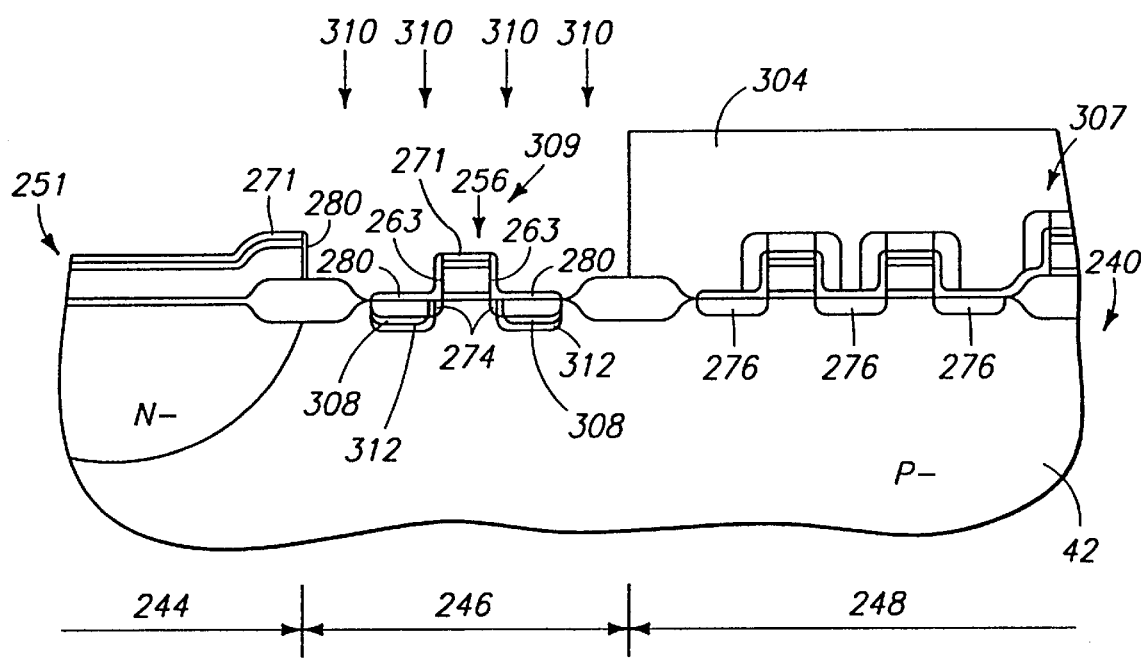
FIG. 32 is a view of the FIG. 7 wafer fragment shown at a processing step subsequent to that of FIG. 28 in accordance with a sixth embodiment of the invention.

Referring to FIG. 32, a semiconductor wafer fragment 240 is shown subsequent to the processing step of FIG. 28. Sidewall spacers 288 and 290 have been removed from adjacent unpatterned gate layer strip 251 and gate 256. The sidewall spacers are preferably removed with the etching process which is preferably selective for silicon nitride relative to silicon oxide. As described above, sidewalls 288 and 290, as well as cap layer 272, are preferably formed of silicon nitride. Accordingly, in the preferred process shown, spacers 288 and 290, as well as the capping layer 272 over PMOS region 244 and peripheral NMOS region 246, are selectively removed with the preferable etch process, leaving oxide layers 271 and 280 exposed.

Subsequent to the nitride etch, p-type dopant 310 is implanted to form halo regions 312 operatively adjacent peripheral NMOS gate 256. Preferably, dopant 310 is implanted according to the preferable process described above with reference to FIG. 29.

The exposed oxide layer 280 adjacent sidewalls 263 of gate 256 functions to displace halo implants 312 laterally outward from gate 256. Accordingly, as a result of regions 312 being implanted after oxide layer 280 is formed and regions 274 being implanted prior to oxide layer 280 being formed, the most inward portions of halo regions 312 are spaced laterally outward from gate 256 relative to the most inward portions of LDD regions 274.

An advantage of the process shown in FIG. 32 relative to the process of FIG. 29 is that the FIG. 32 process results in the formation of an insulated word line 307, and yet also results in the formation of a peripheral NMOS transistor device 309 lacking an insulating layer over the oxide layer 271. This is an advantage because it is desirable to have a thick insulating layer surrounding word line 307 so as to avoid shorts between adjacent storage nodes and word line 307, and yet it is also desirable to have little or no insulating layer over the oxide layer 271 of the peripheral NMOS transistor device during subsequent processing steps. Such an insulating layer complicates later processes forming contact to the refractory metal layer 272. The peripheral NMOS active area may, in fact, be severely damaged when a thick insulating layer on top of the peripheral NMOS gate is cleared during such contact forming steps.

Figure 33:
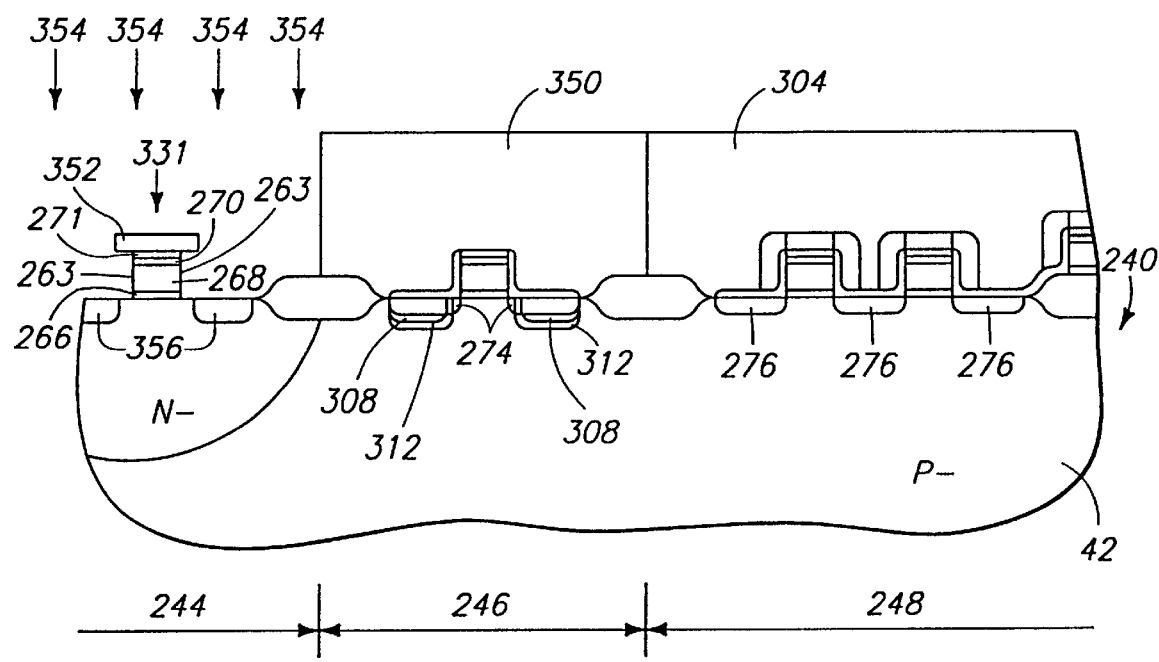
FIG. 33 is a view of the FIG. 7 wafer fragment shown at a processing step subsequent to that of FIG. 32.

Referring to FIG. 33, a masking layer 350, preferably of photoresist, is provided over peripheral NMOS region 246. Subsequently, a PMOS transistor gate 331 is patterned from gate layer strip 251. Gate 331 comprises a gate oxide layer 266, a polysilicon layer 268, a refractory metal layer 270 and an upper oxide layer 271. The gate 331 also comprises a pair of opposing lateral sidewalls 263.

After PMOS gate 331 is patterned, an overhanging mask 352, preferably of photoresist, is provided over the gate. Overhanging mask 352 extends laterally outward beyond the opposing lateral sidewalls 263 of gate 331. After provision of mask 352, a p-type dopant 354 is implanted into PMOS region 244 of wafer 42 to form PMOS source/drain regions 356. PMOS source/drain regions 356 are offset from gate 331 by about the overhang of overhanging mask 352. P-type dopant 354 is preferably $BF_2$ and is preferably implanted at a dose of from about $1\times10^{15}$ atoms/cm$^2$ to about $5\times10^{15}$ atoms/cm$^2$ and at an energy of from about 10 KeV to about 40 KeV.

Figure 34:
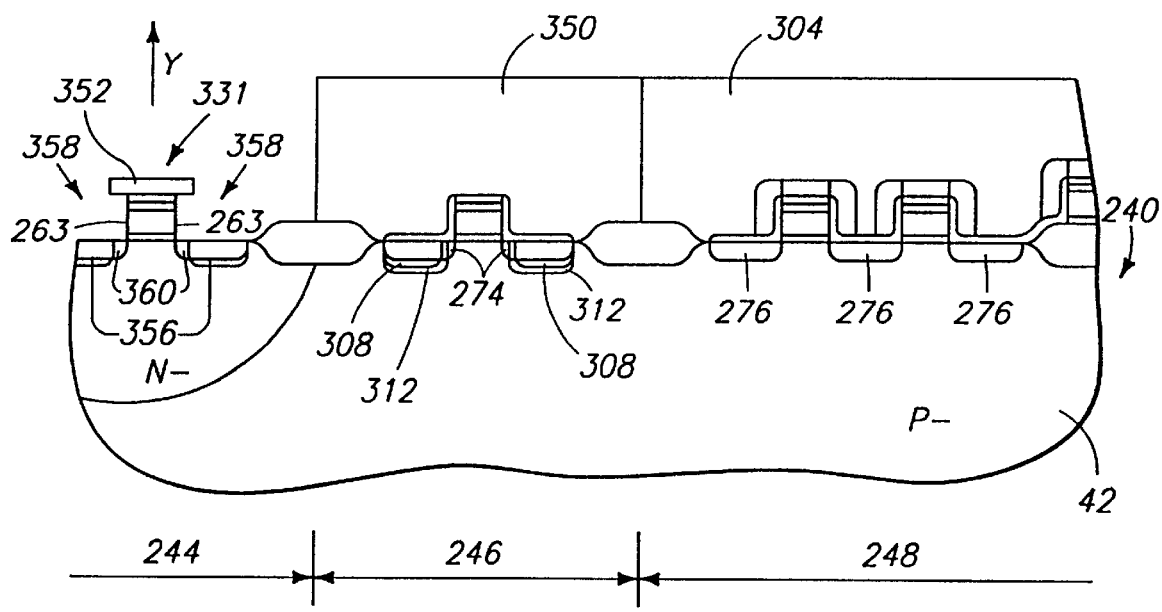
FIG. 34 is a view of the FIG. 7 wafer fragment shown at a processing step subsequent to that of FIG. 33.

Referring to FIG. 34, a dopant 358 is implanted an angle other than parallel to the axis "Y" normal to virtual planar surface 126 of semiconductor wafer material 42 (shown in FIG. 19). Such an angled implant of dopant 358 provides graded junction regions 360 operatively adjacent PMOS transistor gate 331 and inwardly adjacent of source/drain regions 356. Dopant 358 may be either an n-type conductivity enhancing dopant, such as phosphorus, or a p-type conductivity enhancing dopant, such as $BF_2$, depending on whether LDD regions or halo regions are to be formed. Also, multiple angled implants may be performed such that both LDD regions and graded junction regions are formed. The methods for performing such angled implants are known to persons of ordinary skill in the art. In alternative methods of the invention, which are not shown, dopant 358 may be provided at an angle which is parallel to axis "Y" and then diffused to form graded junction regions 360.

Figure 35:
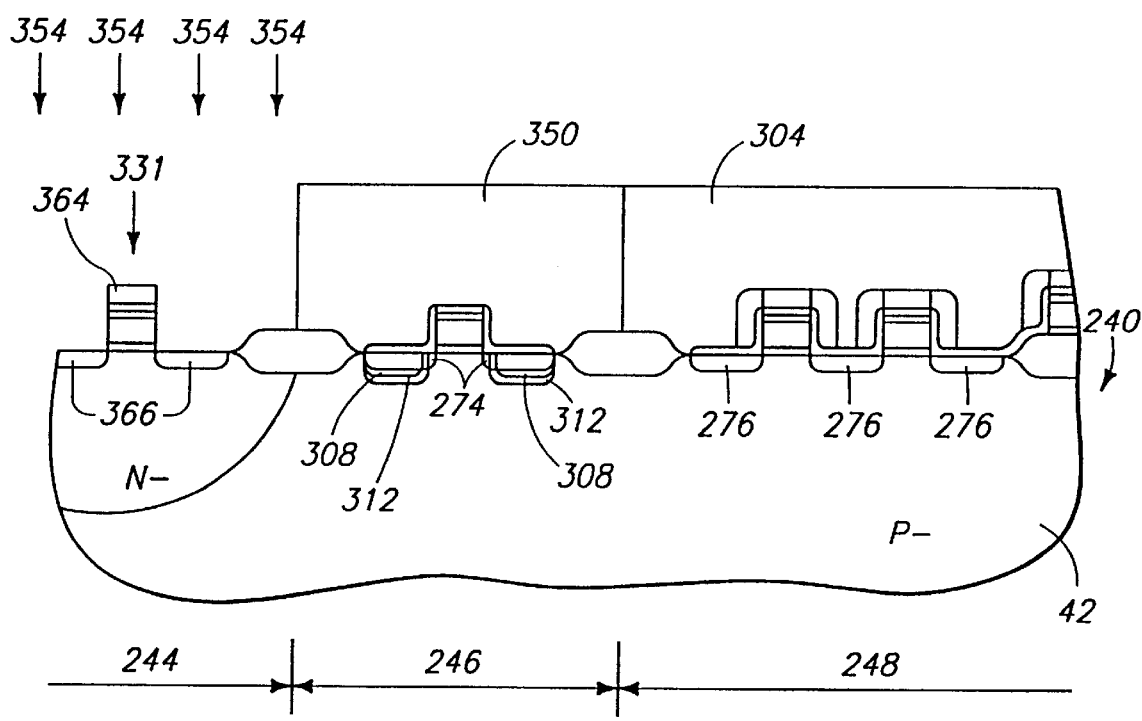
FIG. 35 is a view of the FIG. 7 wafer fragment shown at a processing step subsequent to that of FIG. 32 in accordance with a seventh embodiment of the invention.
Figure 36:
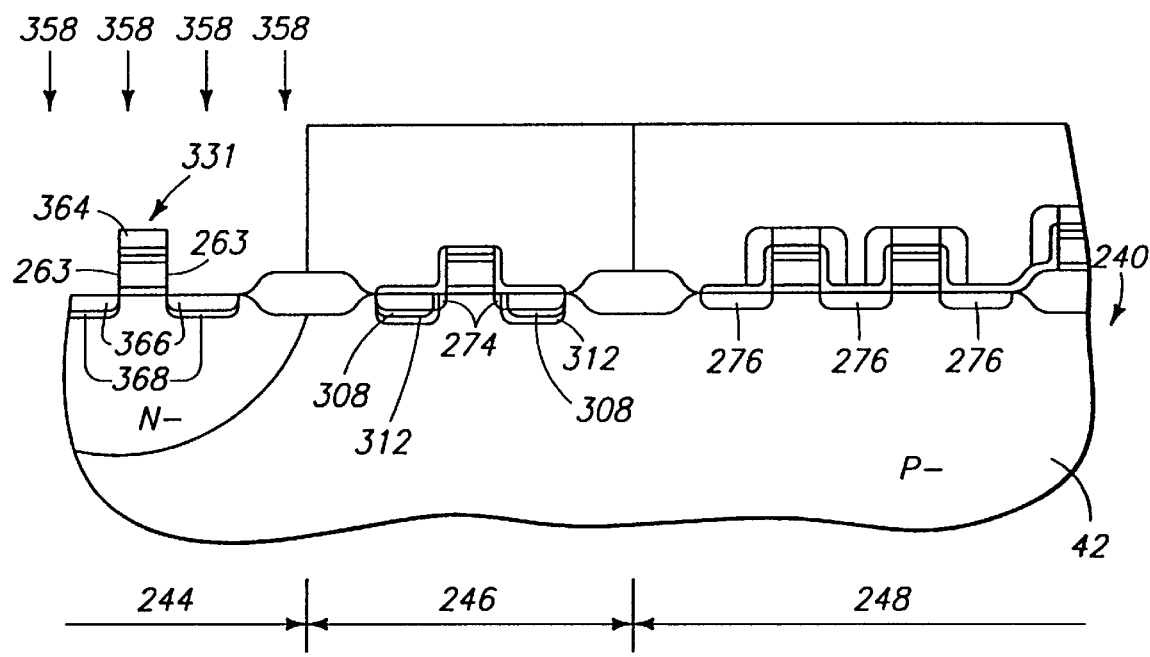
FIG. 36 is a view of the FIG. 7 wafer shown at a processing step subsequent to that of FIG. 35.

Referring to FIGS. 35 and 36, a seventh embodiment of the invention, comprising an alternate method for forming PMOS source/drain regions and graded junction regions subsequent to the step of FIG. 32, is shown. Referring to FIG. 35, a non-overhanging masking layer 364, preferably of photoresist, is provided on top of PMOS transistor gate 331. After provision of masking layer 364, p-type dopant 354 is implanted, preferably as described above with reference to FIG. 33, to form PMOS source/drain regions 366 operatively adjacent PMOS transistor gate 331. Thereafter, as shown in FIG. 36, second dopant 358 is implanted to form graded junction regions 368. As described above with relation to FIG. 34, dopant 358 may be either an n-type dopant or a p-type dopant depending on whether the graded junctions to be formed are to be LDD regions or halo regions. Also, multiple implants of dopant may be provided to form both LDD regions and halo regions operatively adjacent PMOS transistor gate 331.

Figure 37:
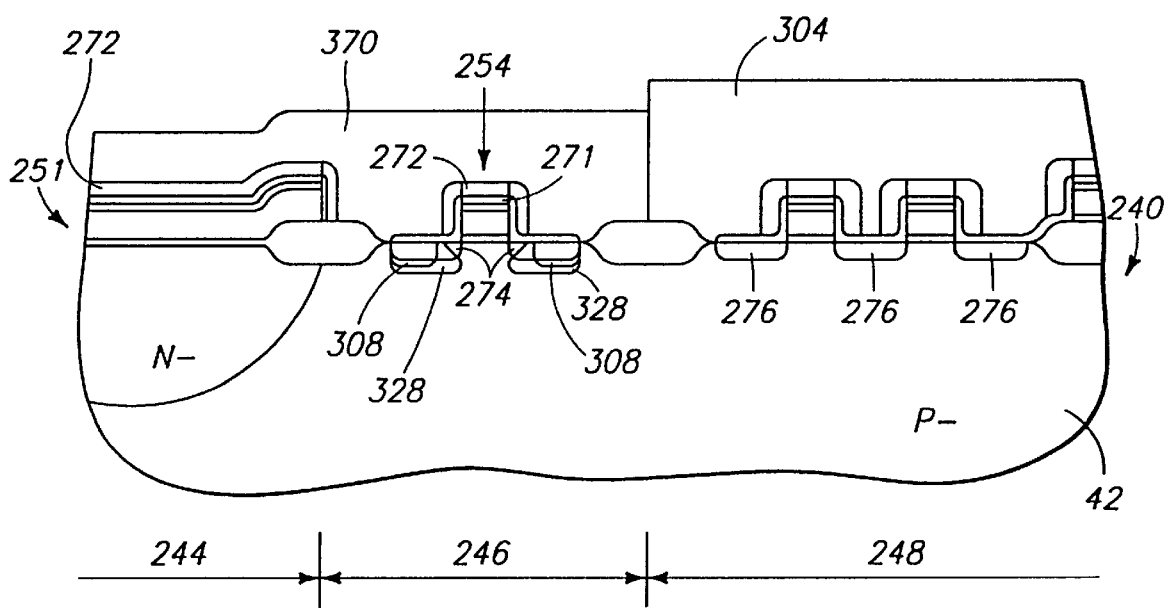
FIG. 37 is a view of the FIG. 7 wafer shown at a processing step subsequent to that of FIG. 29 in accordance with an eighth embodiment of the invention.

FIGS. 37 and 38 illustrate an eighth embodiment of the invention which may follow either FIG. 29 or FIG. 30. In the shown process, the embodiment follows FIG. 30 as indicated by the toed inward halo regions 328.

The embodiment of FIGS. 37 and 38 has the advantage discussed above in relation to FIG. 32 that both an insulated word line 307 (shown in FIG. 38) is formed, and also a peripheral NMOS transistor device 380 (shown in FIG. 38) lacking an insulating layer over the oxide layer 271 is formed. The embodiment of FIGS. 37 and 38 has the further advantage that it produces sidewalls 290 with flat top surfaces 386 (shown in FIG. 38).

Referring to FIG. 37, a masking layer 370 is provided over PMOS region 244 and peripheral NMOS region 246. As shown, masking layer 370 is preferably thinner than the masking layer 304 provided over memory array region 248.

Referring to FIG. 38, masking layers 304 and 370 are etched back such that masking layer 370 is about level with the top of oxide layer 271 of transistor gate 254. Also, the etching conditions are preferably such that sidewall spacers 290 and capping layer 272 are etched. Accordingly, a peripheral PMOS transistor device 380 is formed having sidewall spacers 290 with flat top surfaces 386 and having an exposed oxide layer 271.

Subsequent to the process of FIGS. 37 and 38, a PMOS transistor device may be formed over region 244. Such PMOS transistor device formation may be done, for example, by the procedures described above with reference to FIGS. 31–36.

It is to be understood that the invention is not to be limited by the embodiments shown in the drawings. For instance, silicon oxide layer 280 is shown as formed prior to the peripheral NMOS LDD regions and the memory array source/drain regions throughout the illustrated embodiments. However, silicon oxide layer 280 would not necessarily have to be formed at all, and would also not necessarily need to be formed prior to formation of any of the shown graded junction regions or source/drain regions. Also, although the methods shown in FIGS. 27, 28, 35 and 36 indicate that source/drain regions are formed prior to graded junction regions, the procedures could be reversed such that the graded junction regions are formed prior to the source/drain regions. Also, the procedures could be modified such that graded junction regions are formed both prior to and subsequent to the formation of source/drain regions in applications in which more than one graded junction region implant is performed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor transistor structure comprising:
a region of a semiconductor wafer;
a gate over the region, the gate having first and second sidewalls;
first conductivity type heavily doped first and second source/drain regions proximate the first and second sidewalls, respectively;
first and second oxide layers extending along and at least partially covering the first and second sidewalls, respectively;
first and second sidewall spacers extending along and at least partially covering the first and second oxide layers, respectively, the entirety of the semiconductor wafer under the first and second sidewall spacers being defined as first and second segments, respectively, and the first and second segments being separated from respective first and second source/drain regions by respective first and second gap regions, no part of the first and second gap regions being under respective first and second sidewall spacers; and
second conductivity type halo regions within the first and second gap regions and not extending into the first and second segments.

2. The structure of claim 1 wherein the first and second sidewall spacers comprise silicon nitride.

3. The structure of claim 1 wherein one of the first and second conductivity types is n-type and the other is p-type.

4. The structure of claim 1 wherein the halo regions extend directly under a full lateral extent of the first and second source/drain regions.

5. The structure of claim 1 wherein the first and second sidewalls are opposing sidewalls.

6. The device of claim 1 wherein the first and second gap regions are not under any sidewall spacer.

7. A semiconductor transistor device comprising:
a transistor gate over a semiconductor material wafer, the transistor gate having opposing first and second sidewalls;
first conductivity type, heavily doped, first and second opposing source/drain regions within the semiconductor material wafer beside respective first and second sidewalls;
first and second opposing oxide layers extending along and covering the respective first and second sidewalls;
first and second opposing sidewall spacers extending along and at least partially covering respective first and second oxide layers;
first and second opposing segments consisting of an entirety of the semiconductor wafer material under respective first and second sidewall spacers, the first and second opposing segments being separated from the first and second opposing source/drain regions by respective first and second gap regions of the semiconductor material wafer;
second conductivity type, first and second opposing halo regions within the respective first and second gap regions and not extending into respective first and second segments; and
one of the first and second conductivity types being n-type and the other of the first and second conductivity types being p-type.

8. The device of claim 7 wherein the first and second opposing halo regions extend directly under a full lateral extent of the respective first and second source/drain regions.

9. The device of claim 7 wherein the first and second gap regions each have a lateral length of from about 150 to about 600 Angstroms.

10. The device of claim 7 wherein the first and second oxide layers extend laterally out from the respective first and second sidewalls, directly under the respective first and second sidewall spacers, and directly over respective first and second segments.

11. The device of claim 10 wherein the first and second oxide layers further extend past the respective first and second sidewall spacers, directly over the respective first and second gap regions, and directly over at least a portion of respective first and second source/drain regions.

12. The device of claim 11 wherein the first and second oxide layers further extend to a full lateral extent of the first and second source/drain regions.

13. The device of claim 7 wherein the first and second gap regions are not under any sidewall spacer.

14. A semiconductor transistor structure comprising:
a region of a semiconductor wafer;
a gate over the region, the gate having first and second opposing sidewalls;
first conductivity type heavily doped first and second opposing source/drain regions proximate the first and second opposing sidewalls, respectively;
first and second opposing oxide layers extending along and at least partially covering the first and second sidewalls, respectively;
first and second sidewall opposing spacers extending along and at least partially covering the first and second opposing oxide layers, respectively, the entirety of the semiconductor wafer under the first and second opposing sidewall spacers being defined as first and second segments, respectively, and the first and second segments being separated from respective first and second source/drain regions by respective first and second gap regions, no part of the first and second gap regions being under respective first and second sidewall spacers; and
second conductivity type halo regions within the first and second gap regions and not extending into the first and second segments, wherein one of the first and second conductivity types is n-type and the other is p-type.

15. The structure of claim 14 wherein the first and second sidewall spacers comprise silicon nitride.

16. The structure of claim 14 wherein the halo regions extend directly under a full lateral extent of the first and second source/drain regions.

17. The device of claim 14 wherein the first and second gap regions are not under any sidewall spacer.

* * * * *

UNITED STATES PATENT AND TRADEMARK OFFICE
CERTIFICATE OF CORRECTION

PATENT NO.    : 6,552,394 B2
DATED         : April 22, 2003
INVENTOR(S)   : Aftab Ahmad et al.

It is certified that error appears in the above-identified patent and that said Letters Patent is hereby corrected as shown below:

Drawings,
Fig. 18, replace "56" with -- 54 --.
Fig. 21, replace "56" with -- 54 --.

Column 1,
Lines 6-10, delete in their entirety.

Column 10,
Line 53, replace "transistor By device 105 and an array of NMOS memory" with
-- transistor device 105 and an array of NMOS memory --.

Column 13,
Line 39, replace "and is implanted under the either the conditions described" with
-- and is implanted under either of the conditions described --.

Column 15,
Line 34, replace "form of an array of NMOS memory transistors 303 with" with
-- form an array of NMOS memory transistors 303 with --.

Column 16,
Line 18, replace "about $1X10^{12}$ atoms/cm$^2$ to about $1X10^{12}$ atoms/cm$^2$ and at" with
-- about $1X10^{12}$ atoms/cm$^2$ to about $1X10^{13}$ atoms/cm$^2$ and at --.

Column 17,
Line 18, replace "an insulating layer complicates later processes forming" with
-- an insulating layer complicates later processing of forming --.

UNITED STATES PATENT AND TRADEMARK OFFICE
CERTIFICATE OF CORRECTION

PATENT NO.    : 6,552,394 B2
DATED         : April 22, 2003
INVENTOR(S)   : Aftab Ahmad et al.

It is certified that error appears in the above-identified patent and that said Letters Patent is hereby corrected as shown below:

<u>Column 17 (cont'd),</u>
Line 42, replace "Referring to FIG. 34, a dopant 358 is implanted an angle" with
-- Referring to FIG. 34, a dopant 358 is implanted at an angle --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,552,394 B2  Page 1 of 1
APPLICATION NO. : 09/998420
DATED : April 22, 2003
INVENTOR(S) : Ahmad et al.

It is certified that error appears in the above-identified patent and that said Letters Patent is hereby corrected as shown below:

Delete Fig. 29, and replace with the following figure below:

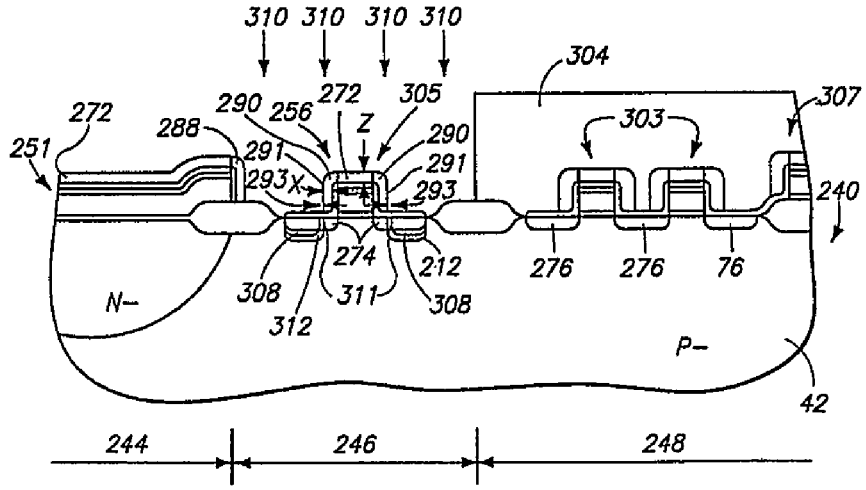

Signed and Sealed this

Eighteenth Day of September, 2007

JON W. DUDAS
*Director of the United States Patent and Trademark Office*